(12) United States Patent
Mori et al.

(10) Patent No.: US 6,762,956 B2
(45) Date of Patent: Jul. 13, 2004

(54) HIGH-SPEED DATA PROGRAMMABLE NONVOLATILE SEMICONDUCTOR MEMORY DEVICE

(75) Inventors: Seiichi Mori, Tokyo (JP); Toru Tanzawa, Ebina (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/241,029

(22) Filed: Sep. 11, 2002

(65) Prior Publication Data

US 2003/0048667 A1 Mar. 13, 2003

(30) Foreign Application Priority Data

Sep. 12, 2001 (JP) ........................... 2001-276796
Jul. 17, 2002 (JP) ........................... 2002-208777

(51) Int. Cl.[7] .............................................. G11C 16/04
(52) U.S. Cl. ............................ 365/185.33; 365/185.29; 365/185.22
(58) Field of Search ..................... 365/185.33, 185.29, 365/185.22, 185.24

(56) References Cited

U.S. PATENT DOCUMENTS

| | | | | |
|---|---|---|---|---|
| 5,949,714 A | * | 9/1999 | Hemink et al. | ........ 365/185.24 |
| 5,949,716 A | * | 9/1999 | Wong et al. | ........... 365/185.33 |
| 6,118,697 A | | 9/2000 | Tanzawa et al. | |
| 6,222,773 B1 | | 4/2001 | Tanzawa et al. | |
| 6,222,779 B1 | * | 4/2001 | Saito et al. | ............ 365/189.09 |
| 6,240,021 B1 | | 5/2001 | Mori | |

OTHER PUBLICATIONS

U.S. patent application Ser. No. 09/953,227, Tanzawa et al., filed Dec. 17, 2001.

U.S. patent application Ser. No. 09/745,802, Mori et al., filed Dec. 26, 2000.

* cited by examiner

*Primary Examiner*—Huan Hoang
(74) *Attorney, Agent, or Firm*—Frommer Lawrence & Haug LLP

(57) ABSTRACT

A semiconductor integrated circuit device includes a memory block. The device performs a programming operation, a pre-programming operation, and an erasing operation. The pre-programming operation by which each of the nonvolatile memory cells in the erased state in the memory block including the nonvolatile memory cells is pre-programmed to an intermediate state between the programmed and erased states.

25 Claims, 18 Drawing Sheets

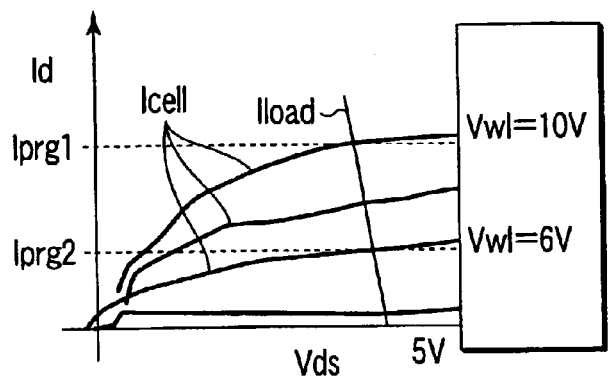 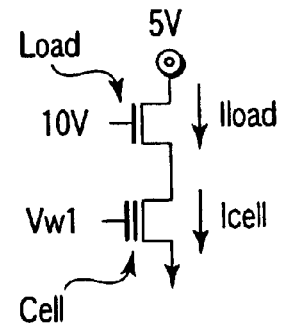
FIG. 5A   FIG. 5B
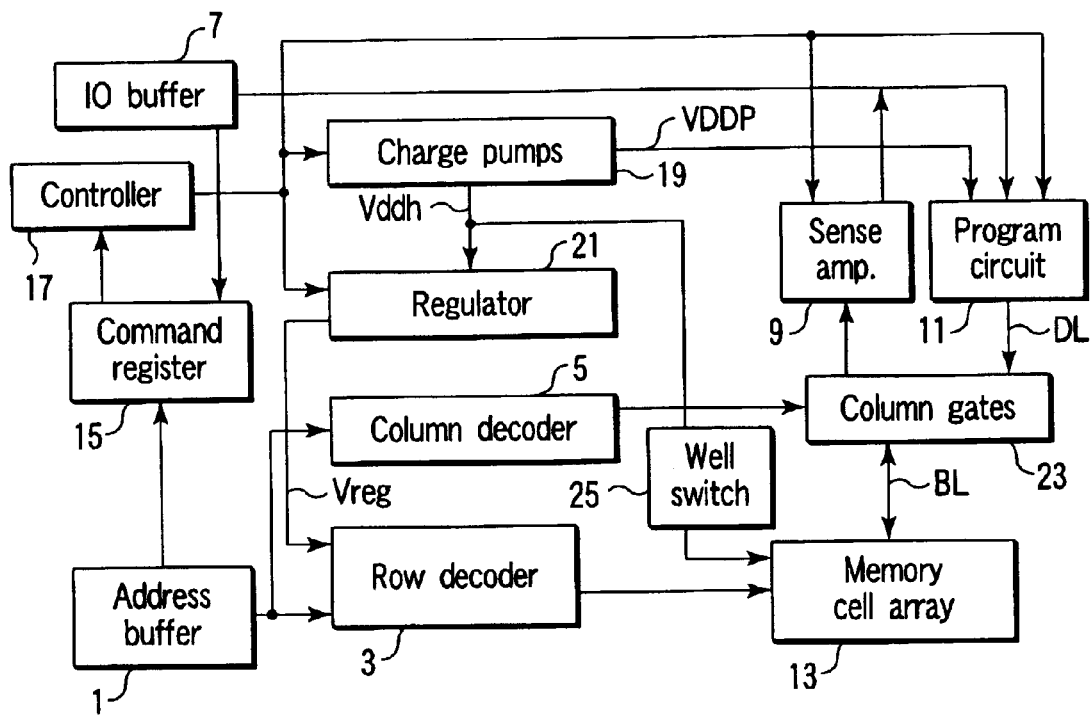
FIG. 6

Internal voltage regulator 21

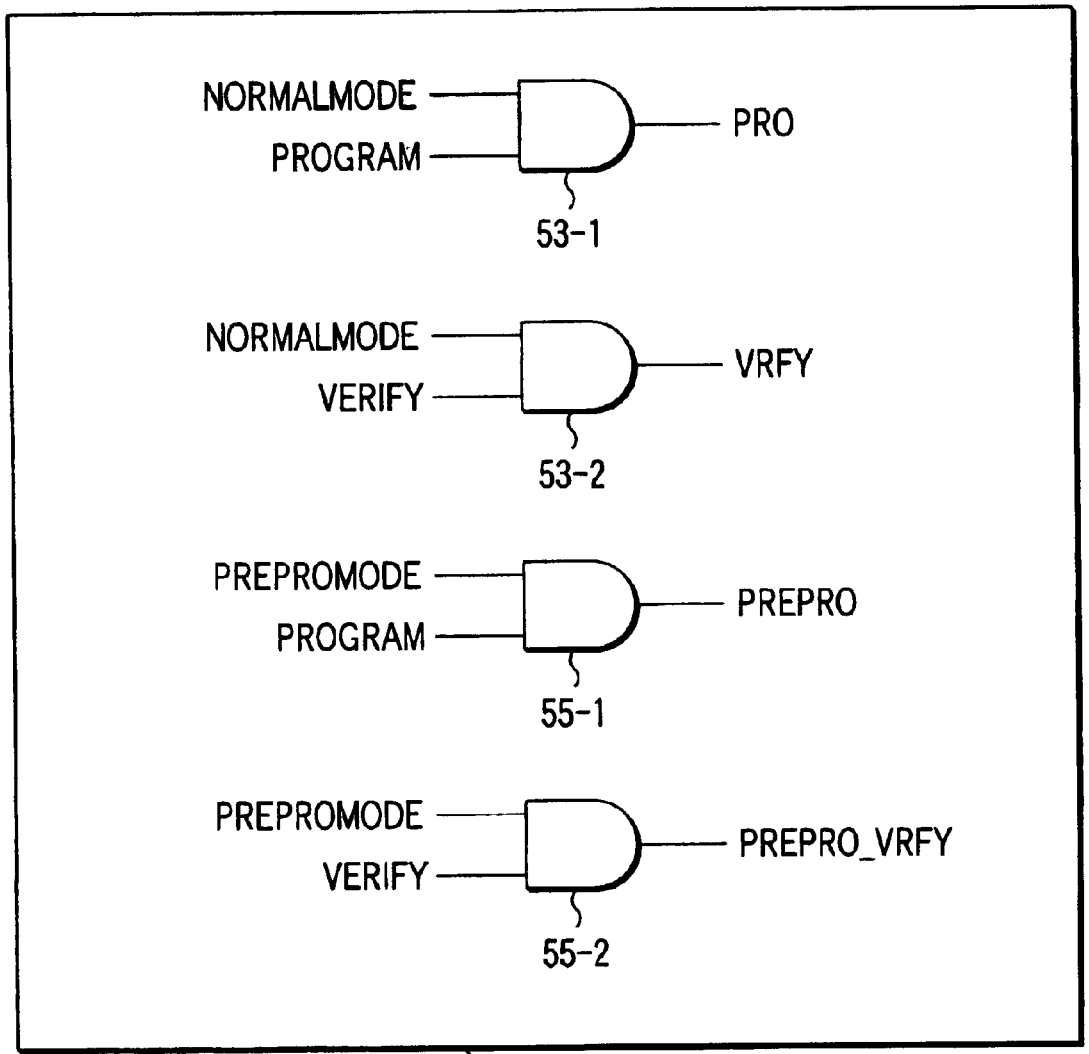
F I G. 12

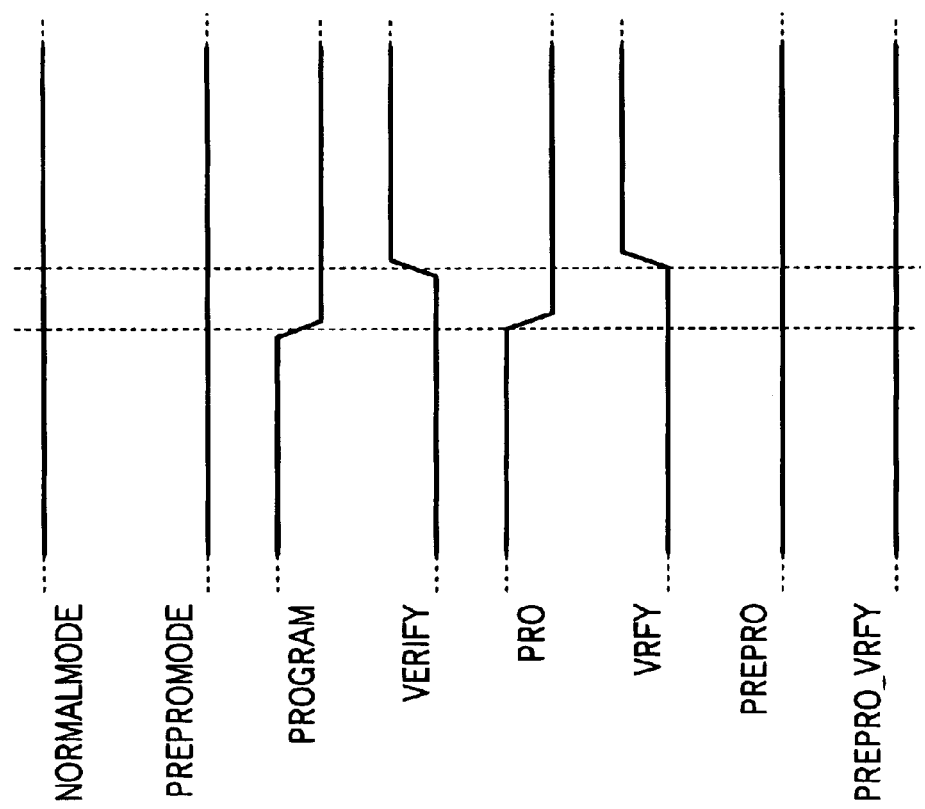
FIG. 13A  Normal program
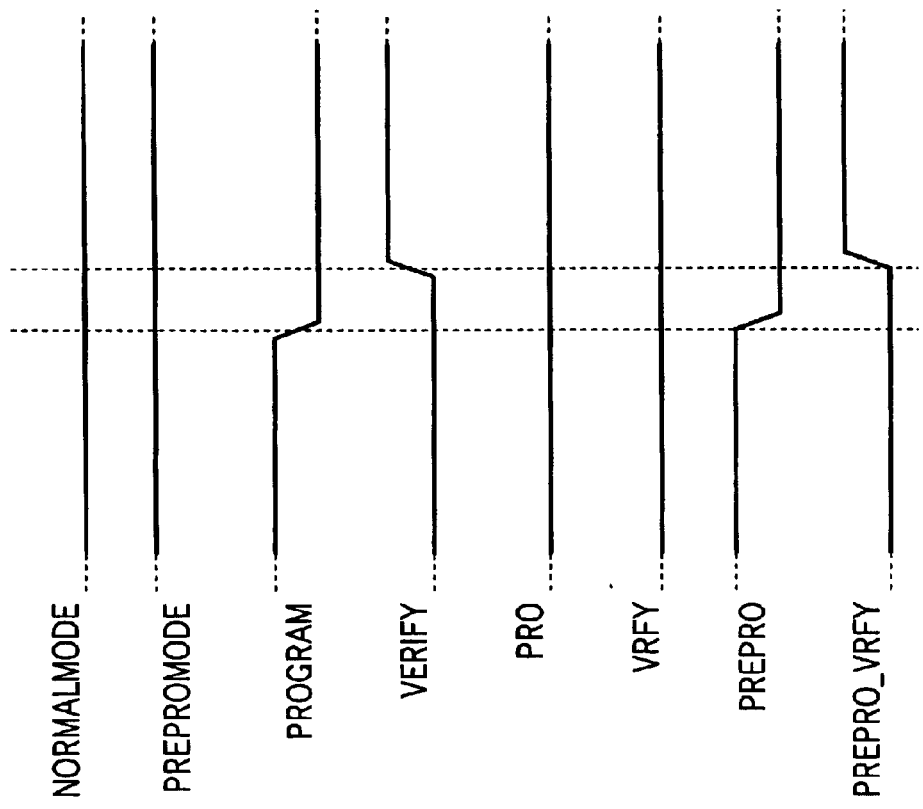
FIG. 13B  Pre-erasing program

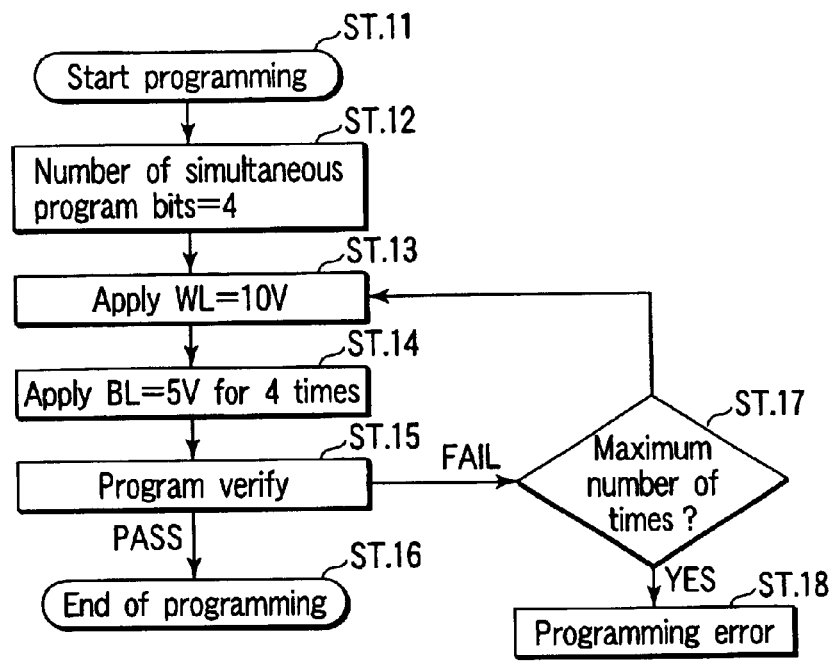
Normal program flow
F I G. 14
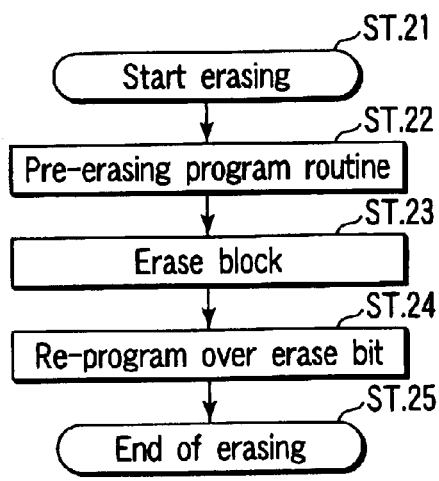
Erase flow
F I G. 15

Pre-erasing program flow

HIGH-SPEED DATA PROGRAMMABLE NONVOLATILE SEMICONDUCTOR MEMORY DEVICE

CROSS-REFERENCE TO RELATED APPLICATIONS

This application is based upon and claims the benefit of priority from the prior Japanese Patent Applications No. 2001-276796, filed Sep. 12, 2001; and No. 2002-208777, filed Jul. 17, 2002, the entire contents of both of which are incorporated herein by reference.

BACKGROUND OF THE INVENTION

1. Field of the Invention

The present invention relates to a semiconductor integrated circuit device, and more particularly to a nonvolatile semiconductor memory device such as a flash memory from which data can be electrically erased.

2. Description of the Related Art

In a NOR type flash memory, batch erasing in units of blocks is performed with, e.g., 512 k being determined as one block. Before erasing, as shown in FIG. 1, there are both cells with data "0" (programmed state) and cells with data "1" (erased state). When the erasing operation is carried out in this state, the threshold voltage of the cell with data "1" (erase state) is shifted to a lower threshold voltage. As a result, it may possibly be shifted to a voltage lower than the applied voltage to a non-selected word line in the programming operation or the read operation, e.g., a voltage lower than 0 V.

When a cell whose threshold voltage is excessively lowered, namely, an over erased cell, occurs, an excessive leak current flows to a bit line in the subsequent program or read operation. For example, when the leak current flows to the bit line during the program operation, the program time can be thereby increased. Further, when the leak current flows to the bit line in the read operation, data of all cells connected to that bit line is erroneously detected as data "1", or the erroneous detection does not occur but the reading speed of data "0" is decreased.

Therefore, as shown in FIG. 2, a so-called "pre-erasing program" operation, by which all the cells are programmed to the level of data "0", is usually performed before carrying out the erasing operation.

When the pre-erasing program operation is carried out, over erasing hardly occurs because all the cells have the data "0" before erasing.

In the pre-erasing program operation, the cells having the data "1" (erased state) are reprogrammed with the data "0" (programmed state). Thereafter, processing advances to the erasing operation. However, in the pre-erasing program operation, the current consumption is high since the channel hot-electron injection is used to program memory cell. Therefore, it is hard to program in many cells at a time, and a very long time is required in order to program all the cells in a block. As memory capacity increases, the number of blocks mounted on the same chip also increases. If the pre-erasing program operation takes time in each block, the time for, e.g., product testing in a factory becomes very long. Of course, due to market demands for data reprogramming at higher speeds, for higher capacity products, it is disadvantageous if data erasing takes time.

BRIEF SUMMARY OF THE INVENTION

A semiconductor integrated circuit device according to a first aspect of the present invention comprises: a programming operation by which a nonvolatile memory cell in an erased state is programmed to a programmed state according to an input program data; a pre-programming operation by which each of the nonvolatile memory cells in the erased state in a memory block including a plurality of nonvolatile memory cells is pre-programmed to an intermediate state between the programmed and erased states; and an erasing operation by which all the nonvolatile memory cells in the memory block are simultaneously erased to the erased state.

A semiconductor integrated circuit device according to a second aspect of the present invention comprises: a programming operation by which a threshold voltage lower than a first voltage for a nonvolatile memory cell is increased to a threshold voltage higher than a second voltage according to an input program data; a pre-programming operation by which a threshold voltage for each of the nonvolatile memory cells in the erased state in a memory block including a plurality of nonvolatile memory cells is increased to a threshold voltage between the first and second voltages; and an erasing operation by which the highest threshold voltage among the threshold voltages for all the nonvolatile memory cells in the memory block is decreased to a threshold voltage lower than the first voltage.

A semiconductor integrated circuit device according to a third aspect of the present invention comprises: a programming circuit by which a nonvolatile memory cell in an erased state is programmed to a programmed state according to an input program data; a pre-programming circuit by which each of the nonvolatile memory cells in the erased state in a memory block including a plurality of nonvolatile memory cells is pre-programmed to an intermediate state between the programmed and erased states; and an erasing circuit by which all the nonvolatile memory cells in the memory block are simultaneously erased to the erased state.

A semiconductor integrated circuit device according to a fourth aspect of the present invention comprises: a programming circuit by which a threshold voltage lower than a first voltage for a nonvolatile memory cell is increased to a threshold voltage higher than a second voltage according to an input program data; a pre-programming circuit by which a threshold voltage for each of the nonvolatile memory cells in the erased state in a memory block including a plurality of nonvolatile memory cells is increased to a threshold voltage between the first and second voltages; and an erasing circuit by which the highest threshold voltage among the threshold voltages for all the nonvolatile memory cells in the memory block is decreased to a threshold voltage lower than the first voltage.

A semiconductor integrated circuit device according to a fifth aspect of the present invention comprises: a programming operation by which a nonvolatile memory cell in an erased state is programmed to one of at least two programmed states according to an input program data; a pre-programming operation by which each of the nonvolatile memory cells in the erased state in a memory block including a plurality of nonvolatile memory cells is pre-programmed to an intermediate state between one of the programmed states and erased state; and an erasing operation by which all the nonvolatile memory cells in the memory block are simultaneously erased to the erased state.

A semiconductor integrated circuit device according to a sixth aspect of the present invention comprises: a programming operation by which a threshold voltage lower than a first voltage for a nonvolatile memory cell is increased to a threshold voltage higher than one of at least two different voltages according to an input program data; a pre-programming operation by which a threshold voltage for each of the nonvolatile memory cells in the erased state in a memory block including a plurality of nonvolatile memory cells is increased to a threshold voltage between one of the at least two different voltages and first voltage; and an erasing operation by which the highest threshold voltage among the threshold voltages for all the nonvolatile memory cells in the memory block is decreased to a threshold voltage lower than the first voltage.

BRIEF DESCRIPTION OF THE SEVERAL VIEWS OF THE DRAWING

FIG. 5A is a view showing a current-voltage characteristic of each of the cell and the load in writing;

FIG. 5B is an equivalent circuit diagram showing the cell and the load;

FIG. 6 is a block diagram showing a structural example of the nonvolatile semiconductor memory device according to the first embodiment of the present invention;

FIG. 12 is a circuit diagram showing a circuit example of a regulator control circuit;

FIG. 13A is an operation waveform chart showing an operation example in usual programming of the regulator control circuit, and FIG. 13B is an operation waveform chart showing an operation example in pre-erasing programming of the regulator control circuit;

FIG. 14 is a flowchart showing an example of an usual program operation sequence;

FIG. 15 is a flowchart showing an example of an erasing operation sequence;

DETAILED DESCRIPTION OF THE INVENTION

Figure 1:
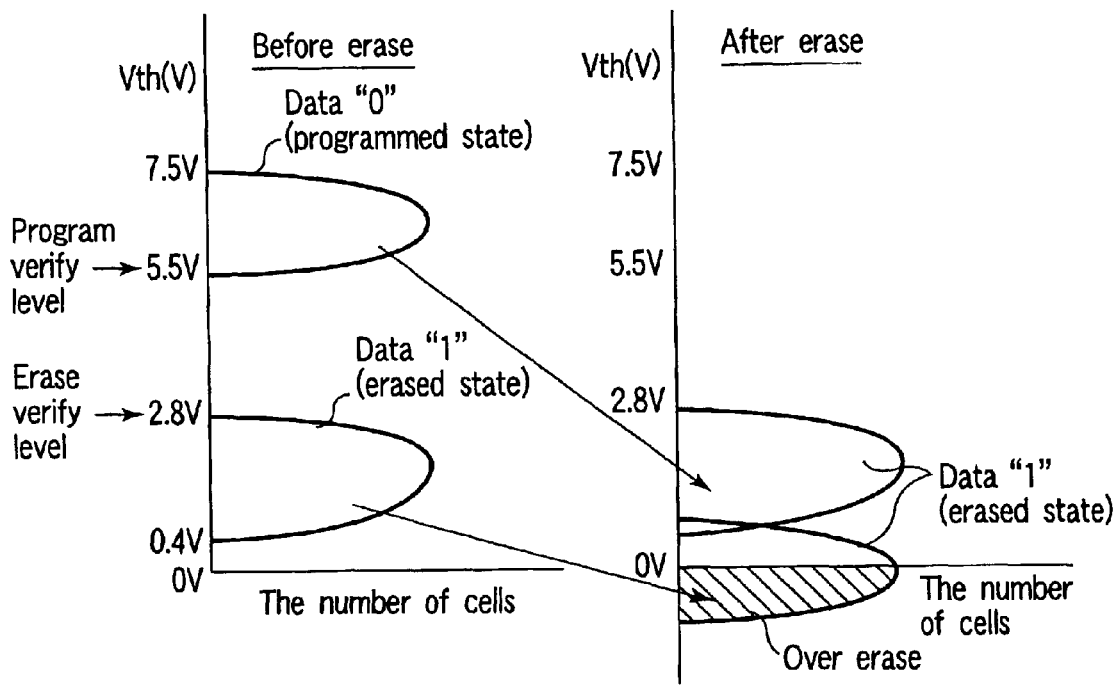
FIG. 1 is a view showing an example of a cell threshold voltage distribution after pre-erasing programming and a cell threshold voltage distribution after erasing of a prior art nonvolatile semiconductor memory device.
Figure 2:
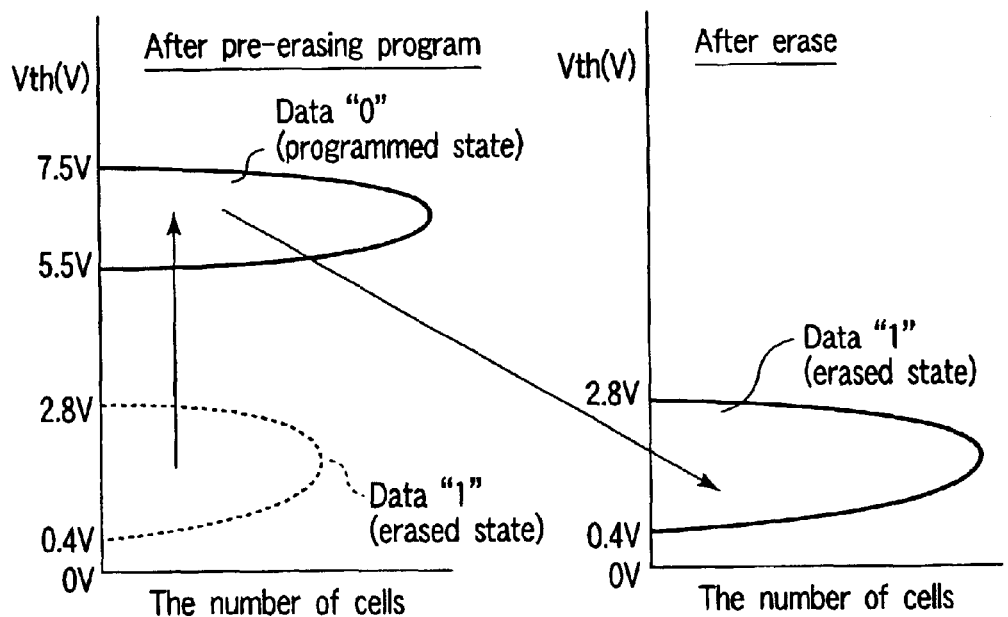
FIG. 2 is a view showing another example of the cell threshold voltage distribution after pre-erasing programming and the cell threshold voltage distribution after erasing of the prior art nonvolatile semiconductor memory device.

Embodiments according to the present invention will now be described with reference to the accompanying drawings. In description, like reference numerals denote like or corresponding parts throughout the drawings.

(First Embodiment)

Figure 3A:
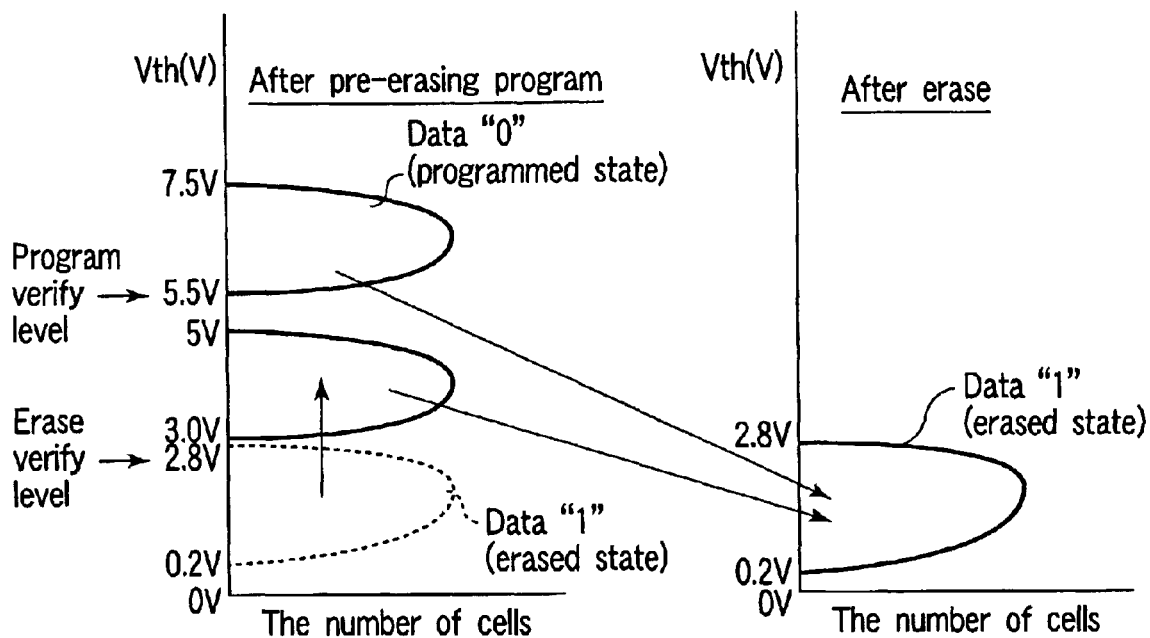
FIG. 3A is a view showing an example of a cell threshold voltage distribution after pre-erasing programming and a cell threshold voltage distribution after erasing of the nonvolatile semiconductor memory device according to the first embodiment of the present invention.

FIG. 3A is a view showing an example of a cell threshold voltage distribution after pre-erasing programming and a cell threshold voltage distribution after erasing of a nonvolatile semiconductor memory device according to a first embodiment of the present invention.

As shown in FIG. 3A, in the nonvolatile semiconductor memory device according to the first embodiment of the present invention, in the case of is performing pre-erasing programming, the cells having data "1" (erased state) are not programmed with data "0" (programmed state), but they are programmed to the intermediate level between the data "1" and the data "0". As to the level to which programming is performed, it is good enough that the cells programmed to the intermediate level are set to a level at which they are not excessively erased when the cells with the data "0" (programmed state) are erased to the data "1" (erased state). For example, when the cells are programmed to the level which is slightly above the data "1" (erased state), the cells are not excessively erased.

Figure 3B:
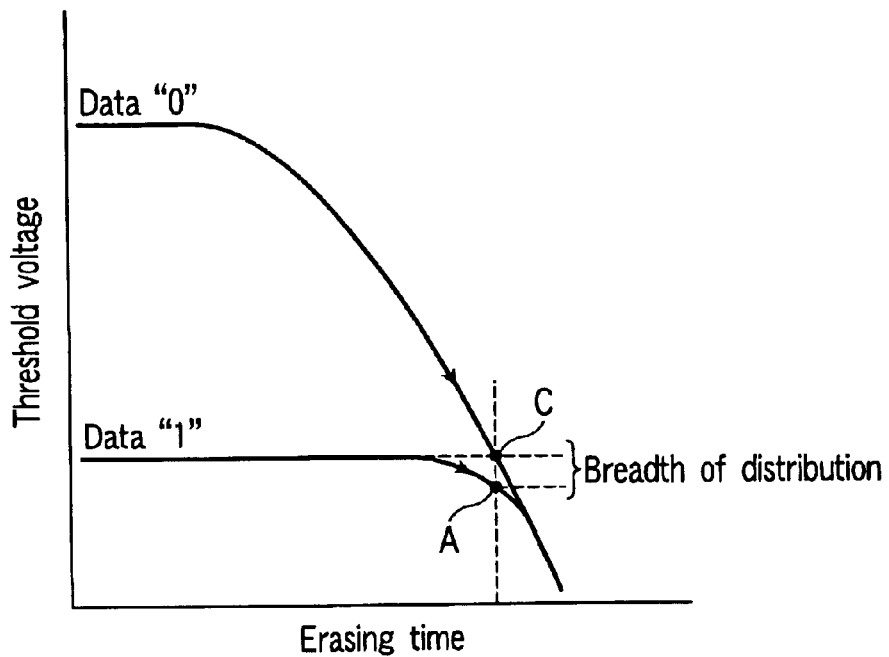
FIGS. 3B and 3C are views showing the relationship between each threshold voltage and an erasing time.
Figure 3C:
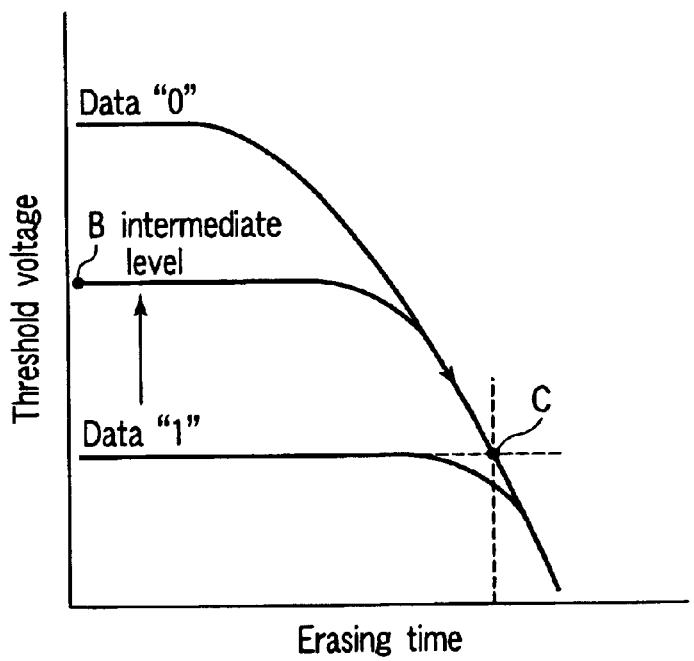

This is due to the characteristic of erasing when erasing is performed by drawing electrons of the cell to a substrate by using a tunneling current mechanism. FIGS. 3B and 3C show the erasing time dependence of a threshold voltage of the cell.

When the cells with the data "0" and data "1" are respectively erased to the erasing level without performing programming in the cell with the data "1", the cell with the data "0" is erased only to a point C, whereas the cell with the data "1" is erased to a point A (FIG. 3B). As a result, a distribution width of the threshold voltage is enlarged.

However, when programming is performed on the cell with the data "1" to, e.g., a point B on the intermediate level, both the cell with the data "0" and the cell on which programming has been performed to the point B on the intermediate level are erased only to the point C (FIG. 3C). That is, the distribution width of the threshold voltage after erasing is the same as that of the case where programming is performed on all the cells to the level of the data "0".

Figure 4A:
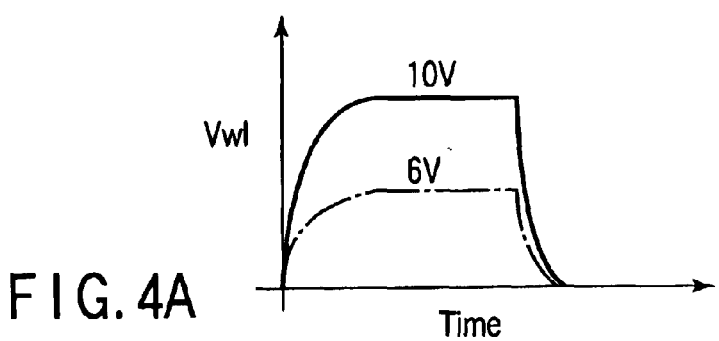
FIG. 4A is a view showing an example of a word line voltage of the nonvolatile semiconductor memory device according to the first embodiment of the present invention.
Figure 4B:
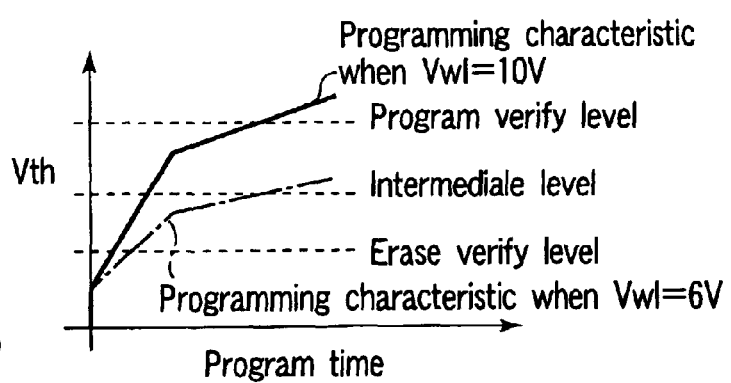
FIG. 4B is a view showing a write characteristic according to the example illustrated in FIG. 4A.

As an example of a method of performing programming to the intermediate level, there is a method of reducing a word line voltage Vw1 at the time of pre-erasing programming as shown in FIG. 4A. For example, the word line voltage Vw1 is determined as 10 V in the usual programming, whereas a voltage such as 6 V is set in this method. As a result, as shown in FIG. 4B, programming is performed at a program verify level (Program verify level), e.g., equal to or above 5.5 V with a cell threshold voltage Vth, whereas programming can be performed to the intermediate level equal to or above 3 V, which is lower than the former by 2.5 V.

When the word line voltage Vw1 in pre-erasing programming is lowered, the current consumption in pre-erasing programming can be lowered, for example. Consequently, the number of cells which can be programmed at one time can be greatly increased as compared with the prior art. For example, assuming that data is programmed in four cells at a time in the prior art, data can be programmed in eight cells at a time in the example of this method. Therefore, the total time required for programming in the cells with data "1" (erased state) in a block to the intermediate time can be reduced to, e.g., ½ as compared with the prior art method which programs data in the cells to the data "0" (programmed state). One interpretation concerning this matter will now be described with reference to the drawings.

FIG. 5A is a view showing a current-voltage characteristic of the cell and the load in programming, and FIG. 5B is an equivalent circuit diagram showing the cell and the load.

As shown in FIG. 5A, as the word line voltage Vw1 increases, the program current Iprg also increases (Iprg1>Iprg2). The program current Iprg is supplied from a booster circuit. Therefore, the number of bits which can be simultaneously programmed is obtained by dividing the supplied current from the booster circuit by the program current Iprg per bit. Based on this, in pre-erasing programming, when the word line voltage Vw1 is reduced below that in usual programming, the number of bits which can be simultaneously programmed can be larger than that in normal programming, thereby reducing the time required for pre-erasing programming. If the number of bits which can be simultaneously programmed is the same as that in the normal programming, the current supply capacity of the booster circuit can be decreased and accordingly the chip size can be reduced.

In this manner, according to the nonvolatile semiconductor memory device of the first embodiment of the present invention, the time required for pre-erasing programming can be reduced, and it is possible to obtain an advantage of an increase in speed for data re-programming, for example.

A structural example of the nonvolatile semiconductor memory device according to the first embodiment of the present invention will now be described.

FIG. 6 is a block diagram showing a structural example of the nonvolatile semiconductor memory device according to the first embodiment of the present invention.

As shown in FIG. 6, an address buffer 1 outputs an address of a memory cell from which data is read or into which data is written to a row decoder (Row decoder) 3 and a column decoder (Column decoder) 5.

An input/output buffer (IO buffer) 7 outputs to the outside of the semiconductor memory the data from the memory cell sensed by a sense amplifier (sense amp.) 9 in data reading, and outputs program data to a program circuit (Program circuit) 11 in data programming.

The program circuit 11 outputs a bit line program voltage according to the inputted program data to a drain of the memory cell arranged in a memory cell array (Memory cell array) 13 through a data line DL.

A command register (Command register) 15 holds inputted commands such as a program command or an erase command. These commands are inputted from the outside of the semiconductor memory and through, e.g., the address buffer 1 and the IO buffer 7 and held in the command register 15. Then, the command register 15 outputs a signal according to a command to an internal circuit control portion (Controller) 17.

The internal circuit control portion 17 outputs to an internal circuit of the nonvolatile semiconductor memory device a signal which controls the operation of this device in accordance with a signal inputted from the command register 15. FIG. 6 shows an example of outputting a signal used for controlling the operation to the sense amplifier 9, the program circuit 11, a booster circuit, e.g., a charge pump circuit (Charge pumps) 19 and an internal voltage regulator (Regulator) 21.

The row decoder 3 selects a word line corresponding to an inputted address.

The column decoder 5 selects a column gate (Column gates) 23 corresponding to the inputted address, and connects a bit line BL to the sense amplifier 9 or the program circuit 11.

The charge pump circuit 19 generates internal voltages Vddh, VDDP or the like required for reading, programming or erasing data. FIG. 6 shows an example of outputting an internal voltage VDDP to the program circuit 11 and outputting an internal voltage Vddh to the internal voltage regulator 21 and a well switch (Well switch) 25.

The internal voltage regulator 21 regulates the internal voltage Vddh and outputs it as an output voltage Vreg having a predetermined voltage value. FIG. 6 shows an example of outputting the output voltage Vreg to the row decoder 3.

The well switch 25 connects a wiring to which the internal voltage Vddh is supplied to the well in such a manner that the internal voltage Vddh is applied to the well in which the memory cell array 13 is formed in, e.g., erasing.

Description will now be given as to an example of the program circuit 11.

Figure 7:
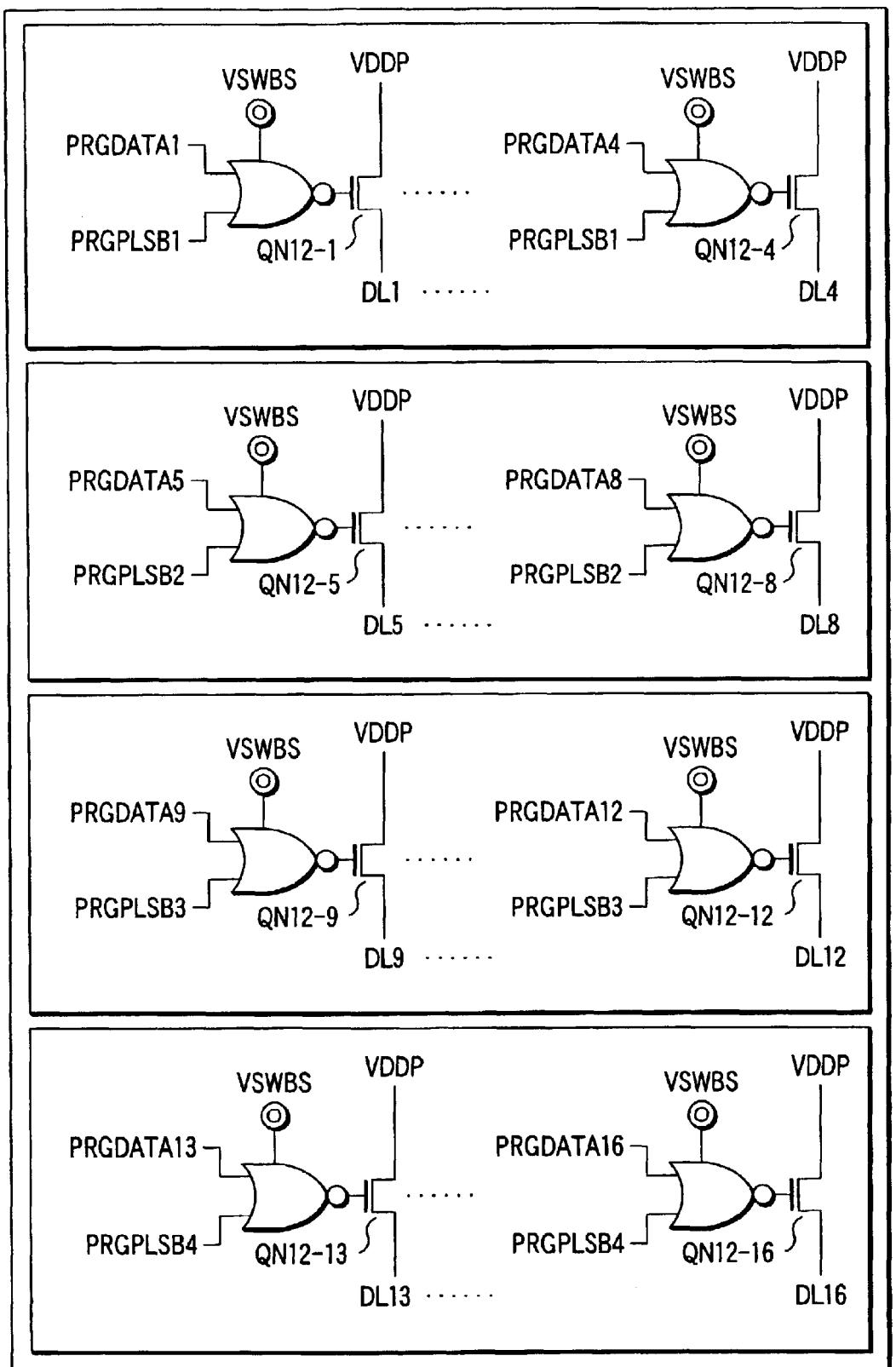
FIG. 7 is a circuit diagram showing an circuit example of a program circuit.

FIG. 7 is a circuit diagram showing a circuit example of the program circuit 11. Note that the program unit is assumed as "1 word=16 bits" in this circuit example.

As shown in FIG. 7, in the program circuit 11 according to the circuit example, the number of bits which can be simultaneously programmed is four. The program circuit 11 receives four program pulses PRGPLSB1 to PRGPLSB4.

[Normal Program Operation]

The program pulses PRGPLSB1 to PRGPLSB4 are sequentially set on the level "LOW" one by one. As a result, the program data PRGDATA1 to PRGDATA16 is transmitted to gates of 16 N-channel type MOSFETs (referred to as NMOSs hereinafter) QN12-1 to 12-16 in units of four for four times. The NMOSs QN12-1 to 12-16 are respectively turned "on" or "off" in accordance with the logic level of the program data PRGDATA1 to PRGDATA16. In this manner, every four bits of the program data PRGDATA1 to PRGDATA16 are programmed in data lines of DL1 to DL16 of 16 bits for four times.

Incidentally, when the NMOS QN12 is turned "on", the internal voltage VDDP is supplied to the data line DL. The internal voltage VDDP supplied to the data line DL is supplied to the bit line BL through the column gate 23. As a result, the bit line program voltage of, e.g., 5 V is supplied to the bit line BL.

Furthermore, the number of bits which can be simultaneously programmed is set in accordance with the current supply capability of the booster circuit, e.g., the charge pump circuit 19, and it is not restricted to four bits.

[Pre-Erasing Program Operation (Pre-Program Operation)]

The program pulses PRGPLSB1 to PRGPLSB4 are divided into two groups of, e.g., a "PRGPLSB1 and PRGPLSB2" group and a "PRGPLSB3 and PRGPLSB4" group. These groups are then sequentially set on the level "LOW" one by one. As a result, every eight bits of the data PRGDATA1 to PRGDATA16 is programmed in the data lines DL1 to DL16 of 16 bits for two times. Consequently, the program pulse application time in pre-erasing program can be reduced to, e.g., ½ of the application time in the normal program operation.

Description will now be given as to an example of the program control circuit which controls the program circuit 11.

Figure 8:
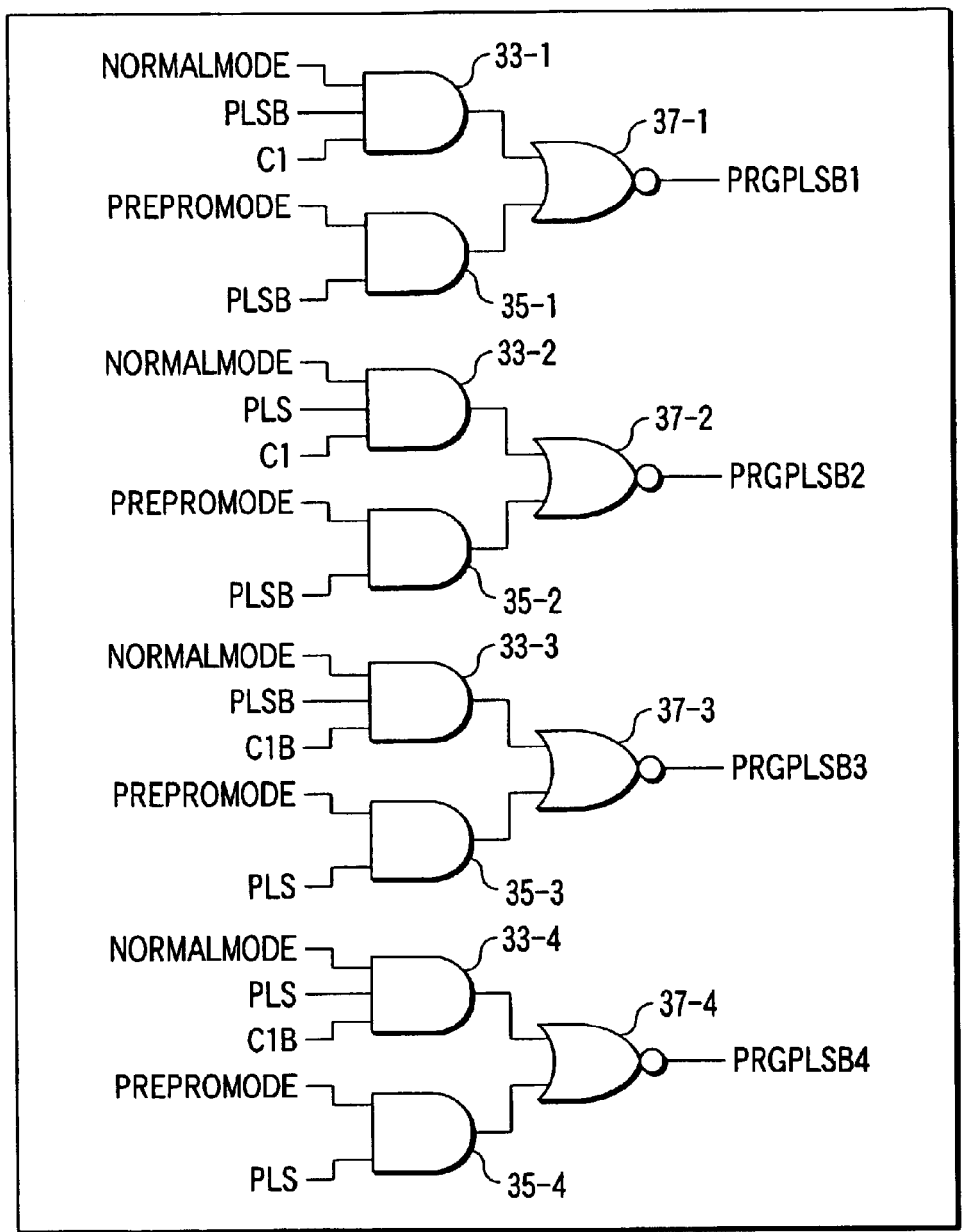
FIG. 8 is a circuit diagram showing a circuit example of a program control circuit.
Figure 9:
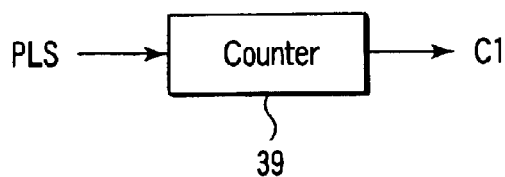
FIG. 9 is a circuit diagram showing a circuit example of a pulse generation circuit.
Figure 10B:
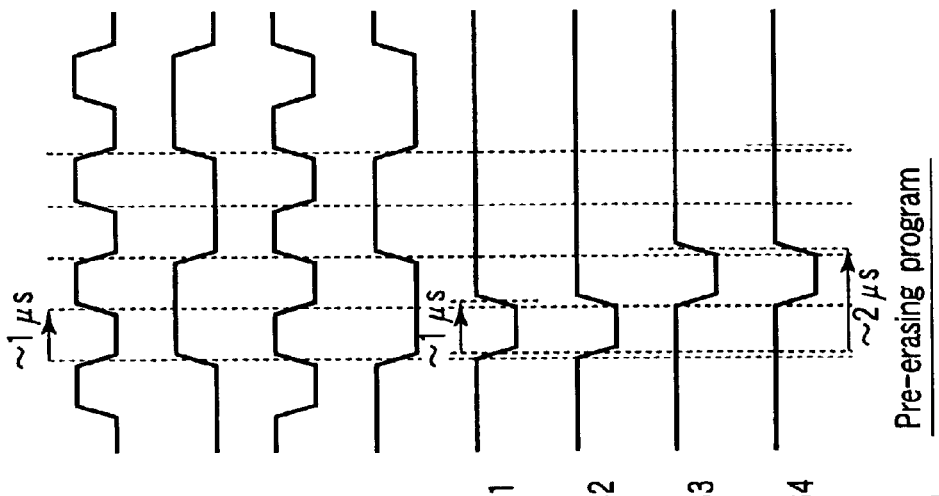
FIG. 10B is an operation waveform chart showing an operation example in pre-erasing programming of the program control circuit.
Figure 10A:
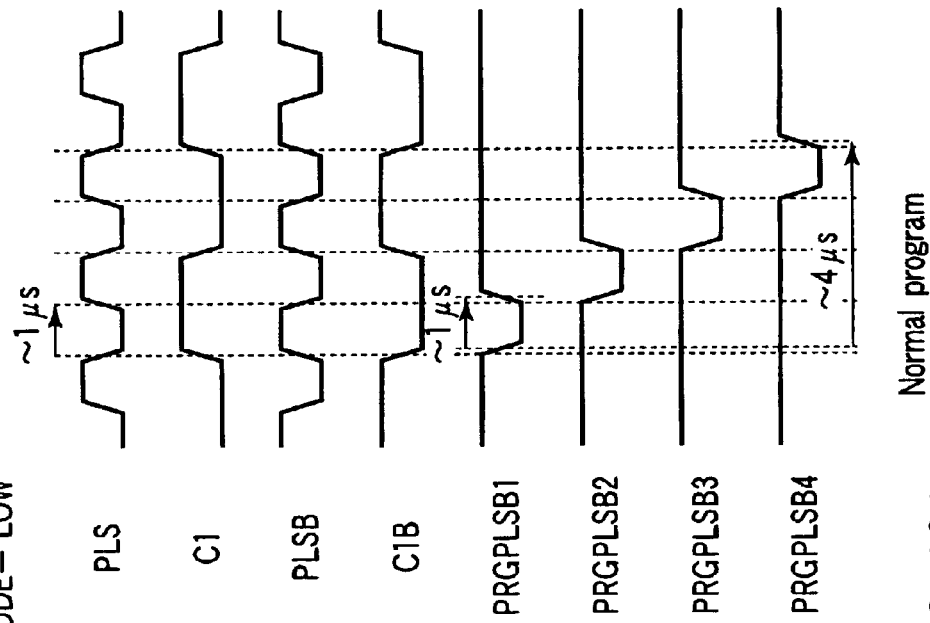
FIG. 10A is an operation waveform chart showing an operation example in usual programming of the program control circuit.

FIG. 8 is a circuit diagram showing a circuit example of the program control circuit, and FIG. 9 is a circuit diagram showing a circuit example of a pulse generation circuit which generates a pulse signal C1. Moreover, FIG. 10A is an operation waveform chart showing an operation example of the program control circuit in normal program, and FIG. 10B is an operation waveform chart showing an operation example of the program control circuit in pre-erasing program.

As shown in FIG. 8, the program control circuit 31 according to the circuit example receives a signal NORMALMODE indicative of the normal program operation and a signal PREPROMODE indicative of the pre-erasing program operation.

[Normal Program Operation]

The signal NORMALMODE is set to the level "HIGH" and the signal PREPROMODE is set to the level "LOW". In this state, the logic gate circuits which receive the signal NORMALMODE, e.g., AND gate circuits 33-1 to 33-4, are activated, and the logic gate circuits which receive the signal PREPROMODE, e.g., AND gate circuits 35-1 to 35-4, are deactivated. In the activated AND gate circuits 33-1 to 33-4, their outputs are set to either the level "HIGH" or "LOW" in accordance with the logic levels of pulse signal PLS (or PLSB) and pulse signal C1 (or C1B). In the deactivated AND gate circuits 35-1 to 35-4, their outputs are fixed to the level "LOW" irrespective of the logic level of the pulse signal PLS (or PLSB). The logic gate circuits, e.g., NOR gate circuits 37-1 to 37-4 receive outputs on the level "LOW" from the AND gate circuits 35-1 to 35-4 and are activated. As a result, the NOR gate circuits 37-1 to 37-4 set the outputs to either the level "HIGH" or "LOW" in accordance with the output level from the AND gate circuits 33-1 to 33-4.

FIG. 10A shows an operation example of such a normal program operation.

As shown in FIG. 10A, in the normal program, the program control circuit 31 sets the program pulses PRGPLSB1 to PRGPLSB4 to the level "LOW" one by one.

Note that the relationship between the cycle of the pulse signal PLS (or PLSB) and the cycle of the pulse signal C1 (or C1B) is determined as, e.g., "1:2" in this circuit example. This relationship is set in order to generate four program pulses PRGPLSB1 to PRGPLSB4. As shown in FIG. 9, the signal PLS (or PLSB) and the pulse signal C1 (or C1B) having such a relationship can be obtained by counting the pulse signal PLS (or PLSB) by, e.g., a counter circuit 39. Of course, besides the circuit example shown in FIG. 9, it is possible to obtain the pulse signal PLS (or PLSB) and the pulse signal C1 (or C1B) having the above-described relationship by diving the pulse signal to "½" for example.

[Pre-Erasing Program Operation]

The signal NORMALMODE is set on the level "LOW" and the signal PREPROMODE is set on the level "HIGH". In this state, the AND gate circuits 33-1 to 33-4 are activated, and the AND gate circuits 35-1 to 35-4 are deactivated. In the activated AND gate circuits 35-1 to 35-4, the outputs are set on either the level "HIGH" or "LOW" in accordance with the logic level of the pulse signal PLS (or PLSB). In the deactivated AND gate circuits 33-1 to 33-4, the outputs are fixed to the level "LOW" irrespective of the logic level of the pulse signal PLS (or PLSB) or the pulse signal (or C1B). The NOR gate circuits 37-1 to 37-4 receive outputs on the level "LOW" from the AND gate circuits 33-1 to 33-4. As a result, the NOR gate circuits 37-1 to 37-4 set the outputs on either the level "HIGH" or "LOW" in accordance with the output level from the AND gate circuits 35-1 to 35-4.

FIG. 10B shows an operation example in a pre-erasing program.

As shown in FIG. 10B, in a pre-erasing program, the program control circuit 31 simultaneously sets the program pulses PRGPLSB1 and PRGPLSB2 to the level "LOW" and then simultaneously sets the program pulses PRGPLSB3 and PRGPLSB4 to the level "LOW".

In this manner, the program control circuit 31 according to this circuit example varies the number of program bits depending on the normal program and the pre-erasing program. Based on such a function, the program control circuit 31 can be expressed as a program bit number variable circuit. In the program bit number variable circuit in this example, the number of program bits can be changed depending on, e.g., the normal program and the pre-erasing program.

In addition, in a pre-erasing program, the number of program bits increases. Therefore, as shown in FIG. 10B, the program pulse application time in a pre-erasing program is reduced to approximately 2 $\mu$s, i.e ½ of 4 $\mu$s, as in the normal program operation shown in FIG. 10A.

An example of the internal voltage regulator 21 will now be described.

Figure 11:
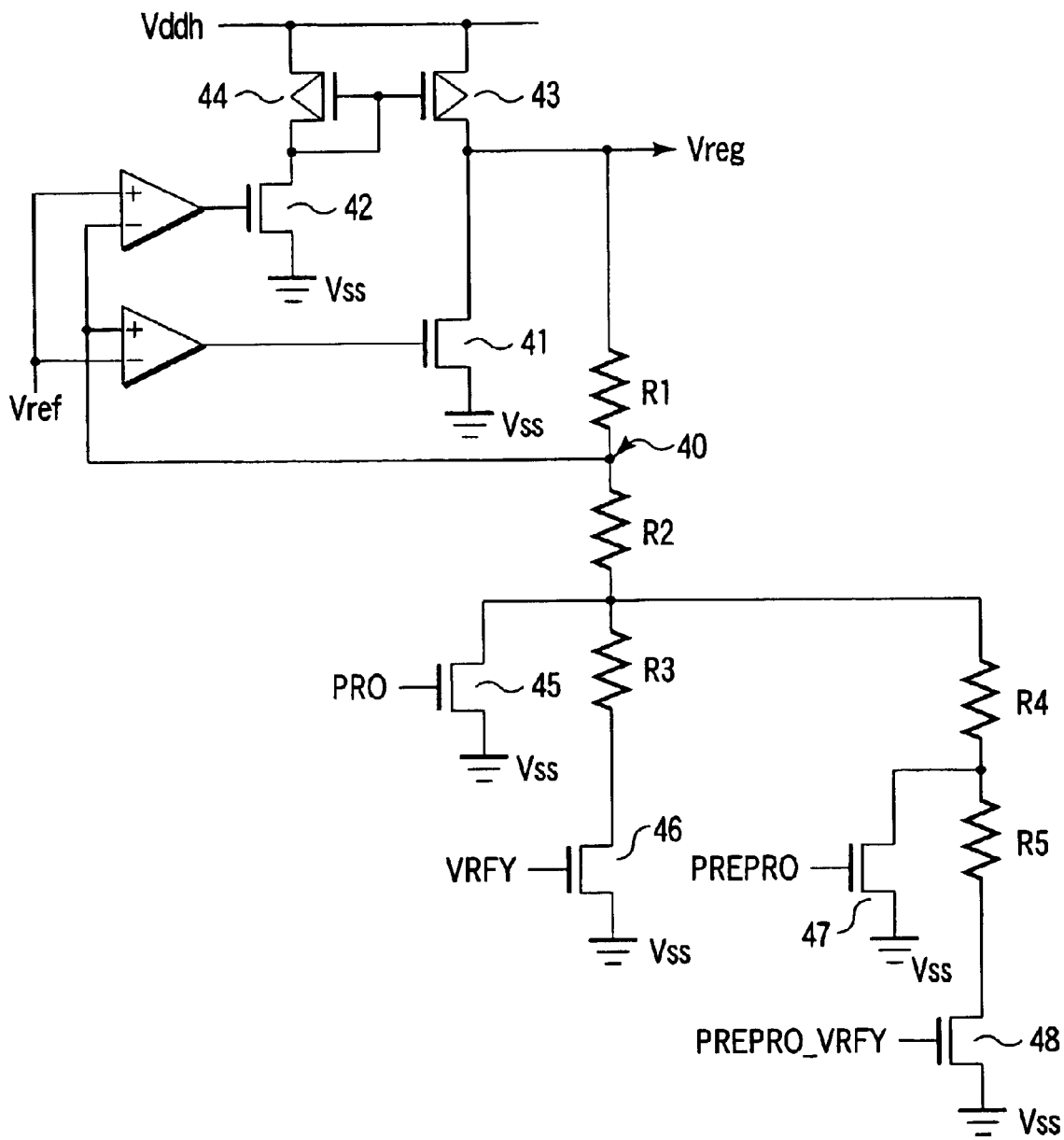
FIG. 11 is a circuit diagram showing a circuit example of an internal voltage regulator.

FIG. 11 is a circuit diagram showing a circuit example of the internal voltage regulator 21.

As shown in FIG. 11, the regulator 21 according to the circuit example divides the output voltage Vreg by resistances (R1 to R5), and compares the voltage at a voltage division point 40 with a reference voltage Vref. Then, in accordance with the comparison result, the regulator 21 controls, e.g., a current mirror circuit including the NMOS 41 and 42 and P-channel type MOSFETs (which will be referred to as PMOSs hereinafter) 43 and 44. As a result, the internal voltage Vddh generated in, e.g., the charge pump circuit 19 is lowered to a predetermined output voltage Vreg. The output voltage Vreg is supplied to the row decoder 3 and used as, e.g., a word line voltage Vw1.

The predetermined output voltage Vreg outputted from the regulator 21 according to this circuit example can be switched to four values in accordance with, e.g., a program mode (normal program), a verify mode (normal program), a program mode (pre-erasing program) and a verify mode (pre-erasing program). Table 1 shows an example of the output voltage value.

TABLE 1

|  | Vreg (NORMAL PROGRAM) | Vreg (PRE-ERASING PROGRAM) |
| --- | --- | --- |
| PROGRAM | 10 V | 6 V |
| VERIFY | 7 V | 3 V |

Switching of the output voltage value such as that shown in Table 1 is enabled by switching, e.g., a resistance division ratio at the voltage division point 40 in accordance with the four modes. In this circuit example, switching of the resistance division ratio is carried out by switching the resistance value between the voltage division point 40 and in-circuit ground point Vss. Switching of the resistance value is conducted by controlling each of, e.g., four NMOS 45 to 48 in accordance with signals PRO, VRFY, PREPRO and PREPRO_VRFY.

Program Mode (Normal Program)

The signal PRO is set on the level "HIGH", and the signals VRFY, PREPRO and PREPRO_VRFY are set on the level "LOW". Meanwhile, the NMOS 45 is turned on, and the NMOS 46 to 48 are turned off. As a result, the voltage division point 40 is connected to the in-circuit ground point Vss through the resistance R2 and the NMOS 45.

[Verify Mode (Normal Program)]

The signal VRFY is set on the level "HIGH", and the signals PRO, PREPRO and PREPRO_VRFY are set on the level "LOW". Meanwhile, the NMOS 46 is turned "on", and the NMOS 45, 47 and 48 are turned "off". As a result, the voltage division point 40 is connected to the in-circuit ground point Vss through the resistance R2, the resistance R3 and the NMOS 46.

[Program Mode (Pre-Erasing Program)]

The signal PREPRO is set to the level "HIGH", and the signals PRO, VRFY, and PREPRO_VRFY are set to the level "LOW". Meanwhile, the NMOS 47 is turned "on", and the NMOS 45, 46 and 48 are turned off. As a result, the voltage division point 40 is connected to the in-circuit ground point Vss through the resistance R2, the resistance R4 and the NMOS 47.

[Verify Mode (Pre-Erasing Program)]

The signal PREPRO_VRFY is set to the level "HIGH", and the signals PRO, PREPRO and VRFY are set to the level "LOW" respectively. Meanwhile, the NMOS 48 is turned "on", and the NMOS 45 to 47 are turned "off". As a result, the voltage division point 40 is connected to the in-circuit ground point Vss through the resistance R2, the resistance R4, the resistance R5 and the NMOS 48.

In this manner, the internal voltage regulator 21 according to this circuit example generates the program voltage and the verify voltage which vary depending on the normal program mode and the pre-erasing program mode. Based on such a function, the internal voltage regulator 21 can be represented as a voltage generation circuit which generates a voltage which varies depending on the operation mode. The voltage generation circuit in this example generates the program voltage and the verify voltage which vary depending on, e.g., the normal program mode and the pre-erasing program mode.

Description will now be given as to an example of the regulator control circuit which controls the internal voltage regulator 21.

FIG. 12 is a circuit diagram showing a circuit example of the regulator control circuit, FIG. 13A is an operation waveform chart showing an operation example in the normal program mode, and FIG. 13B is an operation waveform chart showing an operation example in the pre-erasing program mode.

As shown in FIG. 12, the regulator control circuit 51 according to a circuit example receives a signal PROGRAM indicative of the program mode and a signal VERIFY indicative of the verify mode. With these signals, it receives the above-described signals NORMALMODE and PRE-PROMODE.

[Normal Program Operation]

The signal NORMALMODE is set to the level "HIGH", and the signal PREPROMODE is set to the level "LOW". In this state, the logic gate circuits which receive the signal NORMALMODE, e.g., the AND gate circuits 55-1 and 55-2 are deactivated. In the activated AND gate circuits 53-1 and 53-2, their outputs are set to either the level "HIGH" or "LOW" in accordance with the logic level of the signal PROGRAM or the signal VERIFY. In the deactivated AND gate circuits 55-1 and 55-2, their outputs are fixed to the level "LOW" irrespective of the logic level of the signal PROGRAM or the signal VERIFY.

FIG. 13A shows an operation example of the normal program operation.

As shown in FIG. 13A, when the signal PROGRAM is on the level "HIGH", the signal PRO is at the level "HIGH". When the signal PROGRAM is shifted from the level "HIGH" to the level "LOW", the signal PRO is shifted from the level "HIGH" to the level "LOW". Thereafter, when the signal VERFY is shifted from the level "LOW" to the level "HIGH", the signal VRFY is shifted from the level "LOW" to the level "HIGH".

[Pre-Erasing Program Operation]

The signal NORMALMODE is set to the level "LOW", and the signal PREPROMODE is set to the level "HIGH". In this state, the AND gate circuits 53-1 and 53-2 are deactivated, and the AND gate circuits 55-1 and 55-2 are deactivated. In the activated AND gate circuits 55-1 and 55-2, their outputs are set to either the level "HIGH" or "LOW" depending on the logic level of the signal PROGRAM or the signal VERIFY. In the deactivated AND gate circuits 53-1 and 53-2, their outputs are fixed to the level "LOW" irrespective of the logic level of the signal PROGRAM or the signal VERIFY.

FIG. 13B shows an operation example in the pre-erasing program mode.

As shown in FIG. 13B, when the signal PROGRAM is at the level "HIGH", the signal PREPRO is at the level "HIGH". When the signal PROGRAM is shifted from the level "HIGH" to the level "LOW", the signal PREPRO is shifted from the level "HIGH" to the level "LOW". Thereafter, when the signal VERFY is shifted from the level "LOW" to the level "HIGH", the signal PREPRO_VRFY is shifted from the level "LOW" to the level "HIGH".

In this manner, the regulator control circuit 51 according to this circuit example controls the value of the program voltage and the value of the verify voltage so as to vary depending on the normal program mode and the pre-erasing program mode. Based on this function, the regulator control circuit 51 can be expressed as a voltage control circuit which variably controls the value of a given voltage depending on the operation mode. The voltage control circuit in this example variably controls the value of the program voltage and the value of the verify voltage depending on, e.g., the normal program mode and the pre-erasing program mode.

Description will now be given as to the operation sequence of the nonvolatile semiconductor memory device according to the first embodiment of the present invention.

Figure 16:
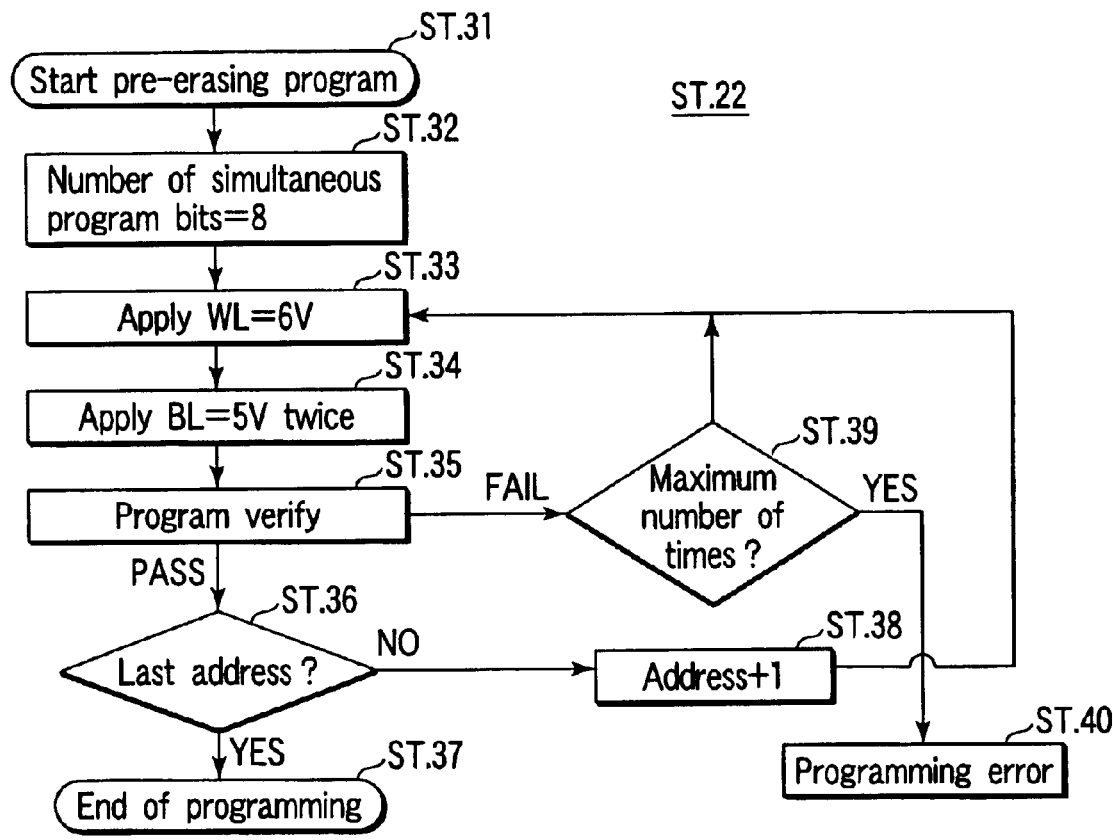
FIG. 16 is a flowchart showing an example of a pre-erasing program operation sequence.

FIG. 14 is a flowchart showing an example of the normal program operation sequence, FIG. 15 is a flowchart showing an example of the erasing operation sequence, and FIG. 16 is a flowchart showing an example of the pre-erasing program operation sequence.

[Normal Program Operation Sequence]

As shown in FIG. 14, the normal program operation is first started based on a command indicative of the normal program operation (ST. 11).

Then, a number of simultaneous program bits is set to, e.g., "4" (ST. 12).

Subsequently, a program voltage of, e.g., 10 V is applied to a word line WL selected for program (ST. 13).

Thereafter, a bit line program voltage of, e.g., 5 V is applied to a bit line BL for, e.g., four times (ST. 14).

It is to be noted that, in ST. 14, the bit line program voltage of, e.g., 5V or 0 V is applied to the bit line BL in accordance with the program data. For example, when programming, e.g., data "0", the bit line program voltage of, e.g., 5 V is applied to the bit line BL. Also, when programming data "1", the bit line program voltage of, e.g., 0 V is applied to the bit line BL.

The program verify operation will now be performed (ST. 15).

If programming was normally carried out as a result of the program verify operation ("PASS"), the normal programming is terminated (ST. 16). On the contrary, programming was not normally carried out ("FAIL"), judgment is made upon whether the number of times of re-programming is the maximum number of times (ST. 17).

If it is the maximum number of times as a result of judgment ("YES"), it is determined as a programming error, and normal programming is terminated (ST. 18). On the contrary, if it is not the maximum number of times ("NO"), the steps of ST. 13 to ST. 15 are repeated.

[Erasing Operation Sequence]

As shown in FIG. 15, erasing is first started based on a command indicative of erasing (ST. 12).

The processing then advances to the pre-erasing program routine (ST. 22).

As shown in FIG. 16, based on progress to the pre-erasing program routine, pre-erasing programming is started (ST. 31).

Then, the number of simultaneous program bits is set to a number which is larger than that of the normal programming, e.g., "8" (ST. 32).

Subsequently, a program voltage which is lower than that of the normal programming, e.g., 6 V is applied to the word line WL selected for programming (ST. 33).

Then, a bit line program voltage of, e.g., 5 V is applied to the bit line BL for, e.g., two times which is smaller than that in the normal programming (ST. 34).

Thereafter, the program verify operation is carried out (ST. 35).

If programming was normally performed as a result of the program verify operation ("PASS"), judgment is made upon whether an address of the cell in which data is programmed is the last address (ST. 36).

If it is the last address as a result of the judgment ("YES"), the pre-erasing programming is terminated (ST. 37). On the contrary, if it is not the last address ("NO"), the address is incremented by, e.g., +1 (ST. 38). Thereafter, the steps of ST. 33 to ST. 36 are repeated.

Further, if programming was not normally carried out as a result of the program verify operation ("FAIL"), judgment is made upon whether a number of times of re-programming is the maximum number of times (ST. 39).

If it is the maximum number of times as a result of the judgment ("YES"), it is determined as a programming error, and the normal programming is terminated (ST. 40). On the contrary, if it is not the maximum number of times ("NO"), the steps of ST. 33 to ST. 35 are repeated.

After completion of the pre-erasing program routine (ST. 22), block erasing is conducted (ST. 23). After termination of the block erasing (ST. 23), re-programming of the over erased bit is performed (ST. 24). Then, after completion of re-programming of the over erased bit (ST. 24), erasing is terminated (ST. 25).

Then, description will now be given as to the memory cell array of the nonvolatile semiconductor memory device according to the first embodiment of the present invention, and an example of the memory cell.

Figure 17:
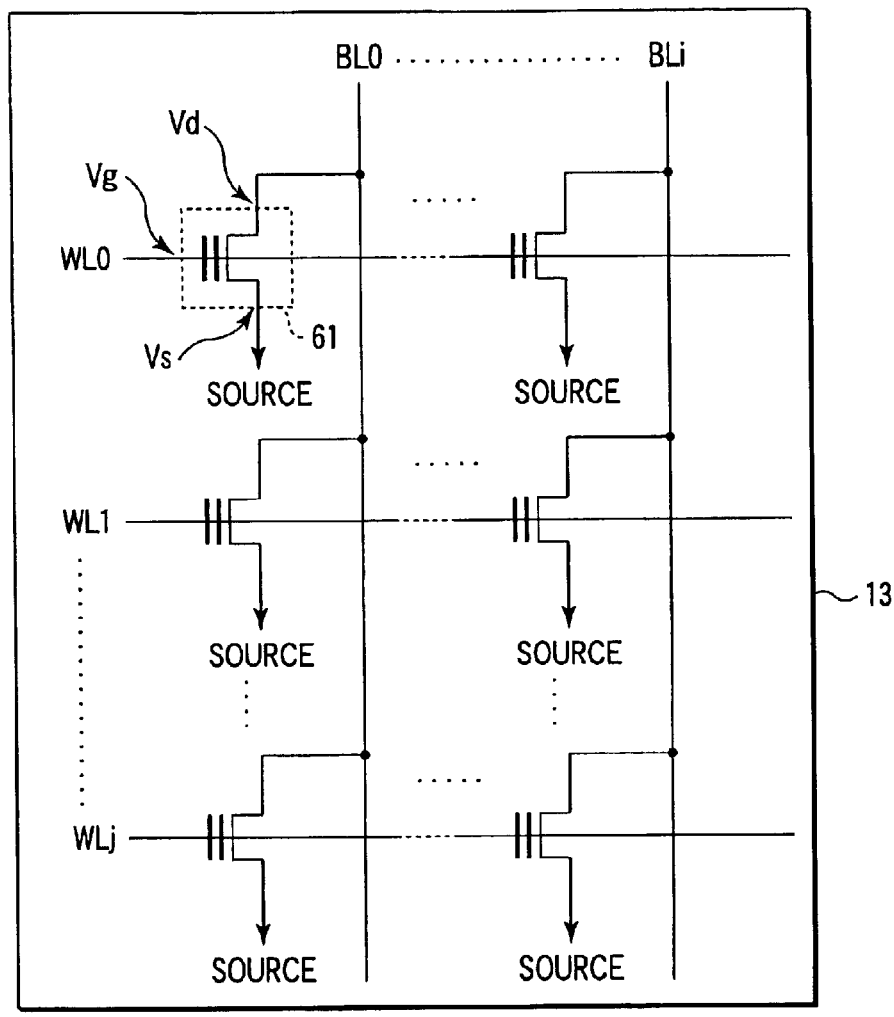
FIG. 17 is an equivalent circuit diagram showing an example of a memory cell array.

FIG. 17 is an equivalent circuit diagram showing an example of the memory cell array.

As shown in FIG. 17, a plurality of nonvolatile memory cells 61 are arranged in the memory cell array 13 in the form of a matrix. The nonvolatile memory cell 61 is, e.g., a transistor which stores therein data in accordance with a level of a threshold voltage (which will be referred to as a cell transistor 61 hereinafter). In the example shown in FIG. 17, a source of the cell transistor 61 is connected to a source line SOURCE, a drain of the same is connected to a bit line BL (BL0 to BLi), and a gate of the same is connected to a word line WL (WL0 to WLj). The nonvolatile semiconductor memory device in which the cell transistors 61 are arranged is generally called an "NOR type". However, the present invention is not restricted to the "NOR type".

Figure 18:
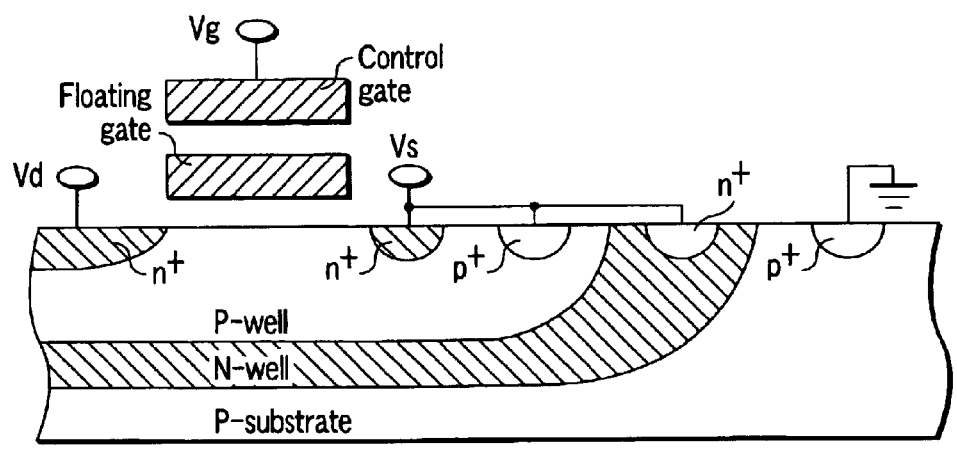
FIG. 18 is a cross-sectional view showing an example of a memory cell.

FIG. 18 is a cross-sectional view showing an example of the cell transistor.

Figure 19:
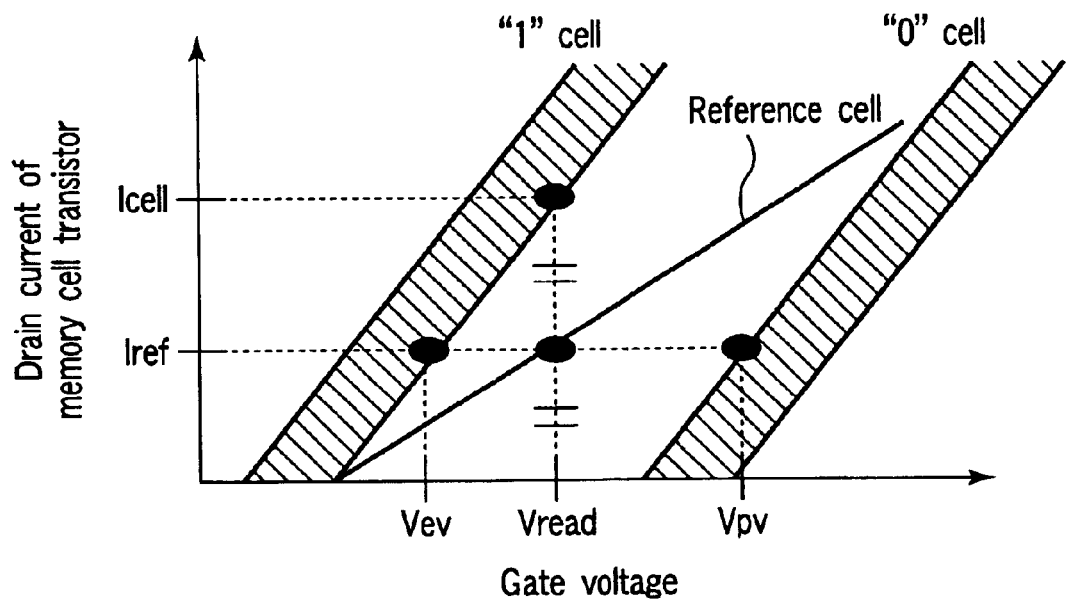
FIG. 19 is a view showing a relationship example between a voltage applied to a control gate (Gate voltage) and a cell current (Drain current of memory cell transistor)

As shown in FIG. 18, an example of the cell transistor has a floating gate (Floating gate) between a control gate (Control gate) and a well (P-well). In the cell transistor of this type, its threshold voltage, e.g., a threshold voltage seen from the control gate varies depending on the number of electrons accumulated in the floating gate. FIG. 19 shows a relationship example between the voltage applied to the control gate (Gate voltage) and the cell current (Drain current of memory cell transistor).

As shown in FIG. 19, if the number of electrons accumulated in the floating gate is relatively large, namely, the threshold voltage is high, data "0" ("0"-cells) is used. On the contrary, when the threshold voltage is low, data "1" ("1"-cells) is used. Tables 2 to 4 show bias condition examples of reading, erasing and programming of data.

TABLE 2

|    | READ    | PROGRAM      | ERASE    |
|----|---------|--------------|----------|
| Vg | TABLE 3 | TABLE 4      | -7 V     |
| Vd | 1 V     | 5 V ("0")    | FLOATING |
|    |         | 0 V ("1")    |          |
| Vs | 0 V     | 0 V          | 10 V     |

TABLE 3

| | READ | | |
|---|---|---|---|
| | | VERIFY READ | |
| | NORMAL READ | NORMAL PROGRAM | PRE-ERASING PROGRAM |
| Vg | 5 V | 7 V | 3 V |

TABLE 4

| | PROGRAM | |
|---|---|---|
| | NORMAL PROGRAM | PRE-ERASING PROGRAM |
| Vg | 10 V | 6 V |

Reading is judged based on whether the cell current flows.

Erasing is collectively carried out in accordance with a plurality of cell transistors which share the source and the well (P-well). At the time of erasing, electrons flow from the floating gate to the well due to the FN tunneling phenomenon, and the stored data in the cell transistors as erasing targets are all changed to data "1".

Programming is performed for every bit. In the case of performing programming of data "0", the bit line to which the cell transistor as a programming target is connected is biased to, e.g., 5 V. As a result, the electrons with a high energy generated due to the channel hot-electron phenomenon are injected into the floating gate. In cases where the data "1" should be unchanged, the bit line to which the cell transistor as the programming target is connected is set to, e.g., 0 V. In this case, injection of electrons does not occur, and the threshold voltage does not vary.

In order to confirm programming or erasing, the program verify operation or the erase verify operation is performed.

In the program verify operation, as shown in FIG. 19, the voltage (Gate voltage) is set as a voltage Vpv which is higher than the voltage Vread at the time of reading, and reading of the data "0" is carried out. Programming and program verification are alternately executed, and the program operation is terminated when all the cells as the programming targets have the data "0".

In the erase verify operation, the voltage is set as a voltage Vev lower than the voltage Vread, and reading of the data "1" is performed. As a result, the cell current Icell is sufficiently assured. When all the cells as erasing targets have the data "1", the erasing operation is terminated.

However, the present invention is not restricted to the above-described cell transistor.

(Second Embodiment)

Figure 20:
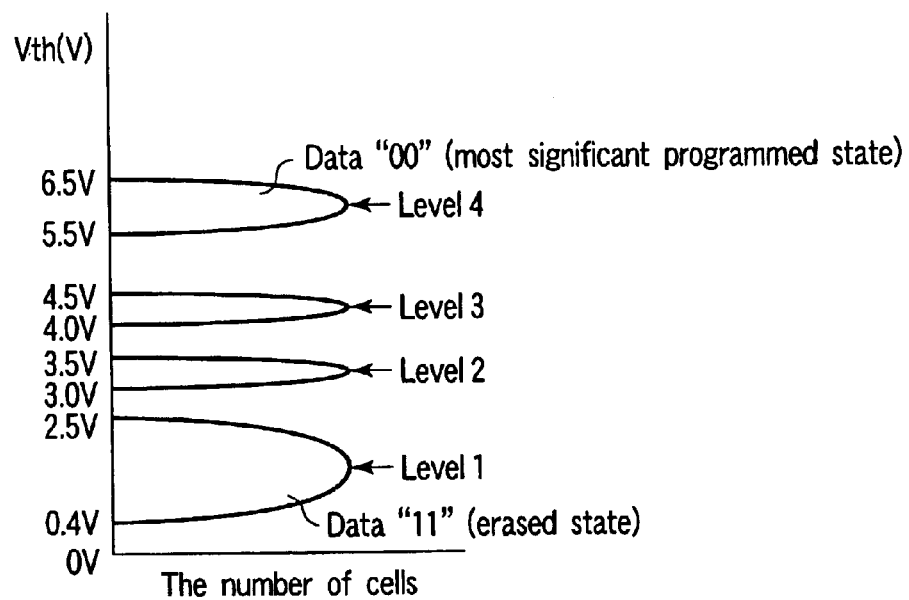
FIG. 20 is a view showing an example of a cell threshold voltage distribution of a nonvolatile semiconductor memory device according to a second embodiment of the present invention.
Figure 21:
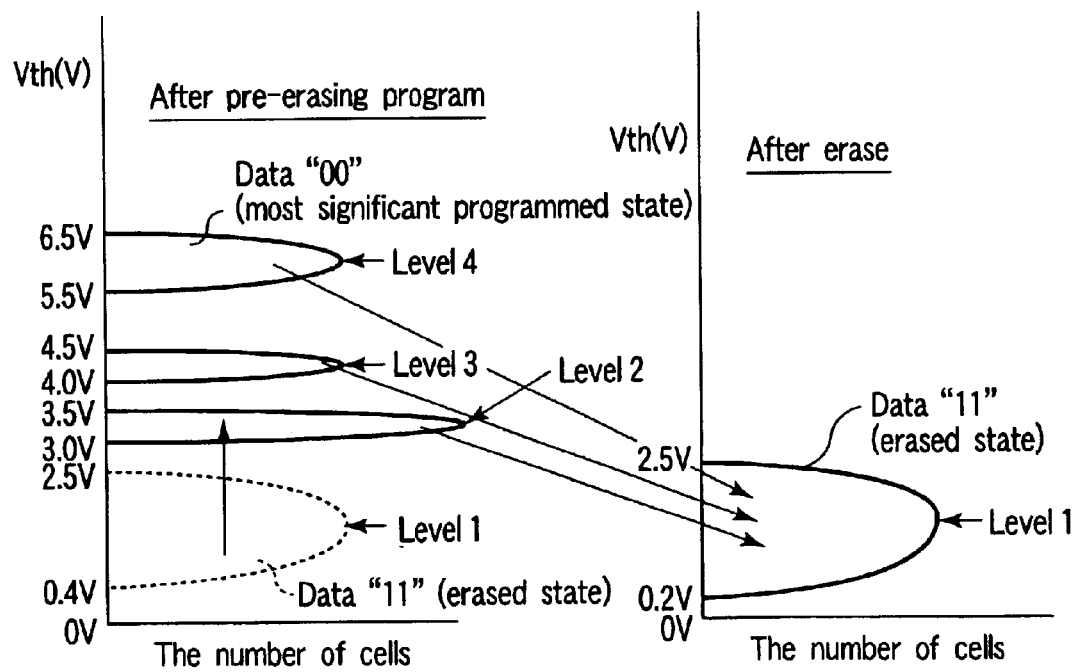
FIG. 21 is a view showing an example of a cell threshold voltage distribution after pre-erasing programming and a cell threshold voltage distribution after erasing of the nonvolatile semiconductor memory device according to the second embodiment of the present invention.

FIG. 20 is a view showing an example of the cell threshold voltage distribution of a nonvolatile semiconductor memory device according to a second embodiment of the present invention, and FIG. 21 is a view showing an example of the cell threshold voltage distribution after pre-erasing programming and the cell threshold voltage distribution after erasing of the nonvolatile semiconductor memory device according to the second embodiment of the present invention.

As shown in FIG. 20, in the nonvolatile semiconductor memory device according to the second embodiment of the present invention, threshold voltages of, e.g., four levels (level 1 to level 4) are stored in one cell, and two-bit information is stored in one cell. This is a so-called multi-valued memory.

In such a multi-valued memory, programming is carried out until the most significant programming state is reached before erasing in the prior art.

On the contrary, in the nonvolatile semiconductor memory device according to the second embodiment, as shown in FIG. 21, programming is carried out in the cell in the erased state until the threshold voltage of the immediate superior level is obtained, for example. Thereafter, the batch erasing operation is started. After the batch erasing, as shown in FIG. 21, the cells are not excessively erased, as in the first embodiment.

In this manner, the present invention can be also applied to a multi-valued memory.

Incidentally, in the second embodiment, the threshold voltage after programming is shifted in the control range of the level 2 in the pre-erasing programming, but it does not have to be precisely shifted in this control range. Generally, it is good enough to set the threshold voltage of erased state to be higher than a lower limit value of the control range of the level 2.

Furthermore, it is good enough to shift the threshold voltage after programming to the most significant programming state, namely, the level other than the level 4.

(Third Embodiment)

A third embodiment of the present invention will be described on a 2-level mode/4-level mode switchable Flash memory.

Figure 22:
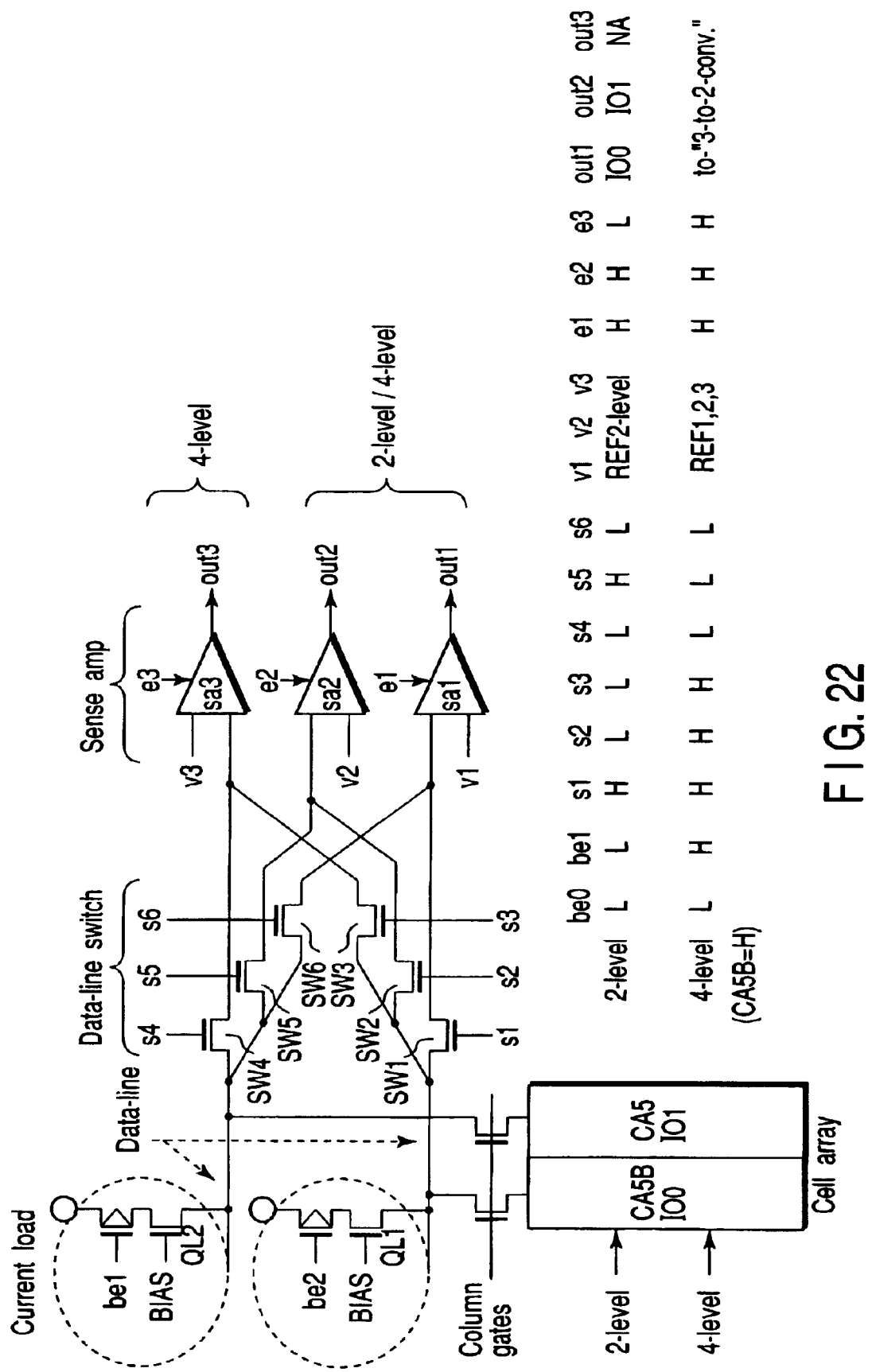
FIG. 22 is a circuit diagram showing a circuit example of a nonvolatile semiconductor memory device according to a third embodiment of the present.

FIG. 22 shows both a connection between sense amplifiers and memory cells in 2-level/4-level switchable Flash memory and control signals.

In FIG. 22, cells 0 belonging to IO0 in 2-level mode and cells 1 belonging to IO1 in the same mode are independent to each other. In 4-level mode, however, 2-bit data of cells 0 and 1 belong to both IO0 and IO1, and the cells 0 and 1 differ in the most significant address of the column.

In order to minimize the number of the sense amplifiers, the sense amplifiers used in 2-level state (sa1 and sa2 sense two data lines) can be employed in 4-level state. Concretely, by using control signals shown in FIG. 22, two in three sense amplifiers required for one cell in the case of 4-level state can be employed as the sense amplifiers required for one cell in the case of 2-level state. As compared with the case of 2-level state, 4-level memory cells can be read by adding one sense amplifier per 4-level cell, thereby enabling 4-level read with minimum overhead.

That is, the Flash memory shown in FIG. 22 includes first memory cells (cells belonging to IO0), second memory cells (cells belonging to IO1), first to fourth reference cells (not shown), first to sixth load current sources, first comparator (sense amplifier) sa1 to third comparator (sense amplifier) sa3 for controlling activation/inactivation conditions by control signals e1, e2 and e3, and a plurality of switching elements sw1, sw2, sw3, sw4, sw5 and sw6 which are controlled as follows.

That is, when a first mode signal be1 is a first logic "L" in 2-level mode, the first memory cells and the first load current source QL1 become a first input of the first comparator sa1, and the second memory cells and the second load current source QL2 become a first input of the second comparator sa2. Further, the first reference cell and the third load current source (not shown) become a second input of both the first and second comparators sa1 and sa2 in common, and the third comparator sa3 is inactivated.

When the first mode signal be1 is a second logic "H" in 4-level mode, the first or second memory cells are connected to the first or second load current source, whereby its connection node becomes the first input of the first to third comparators sa1 to sa3. Further, the second reference cell and the fourth load current source (not shown) become the second input of the first comparator sa1, and the third reference cell and the fifth load current source (not shown) become the second input of the second comparator sa2, and the fourth reference cell (not shown) and the sixth load current source (not shown) become the second input of the third comparator sa3.

For input and output gates connected to the cell array, the access and output of the cells IO1 to IO15 are accomplished with 16 bits in 2-level mode, while they are carried out with 8 bits in 4-level mode.

In 2-level mode, the load currents of two reference cells are on, and reference voltages v1 and v2 thus produced have a voltage "REF2 value" between data line voltages of "0", "1", respectively, thereby to output out1 and 2.

In 4-level mode, only one of data lines becomes an object for read depending upon the most significant address of the column. When CA5B is "H", all of the switching elements s1, s2 and s3 are on, whereby the data is input to the sense amplifiers sa1, sa2 and sa3, respectively. The reference voltages v1, v2 and v3 are three reference levels REF1, 2 and 3 to output out1, 2 and 3.

Thus, by switching over the data lines and the reference voltages, 2-level state can be converted into 4-level state by adding one sense amplifier per cell.

The Flash memory according to the third embodiment can be switchable from 2-level mode to 4-level mode by command or program to ROM, and the number of the sense amplifiers can be minimized by switching over both the switches for connecting the sense amplifiers to the data lines and the switches for connecting the current loads to data lines with 2-level mode or 4-level mode, respectively.

Figure 23:
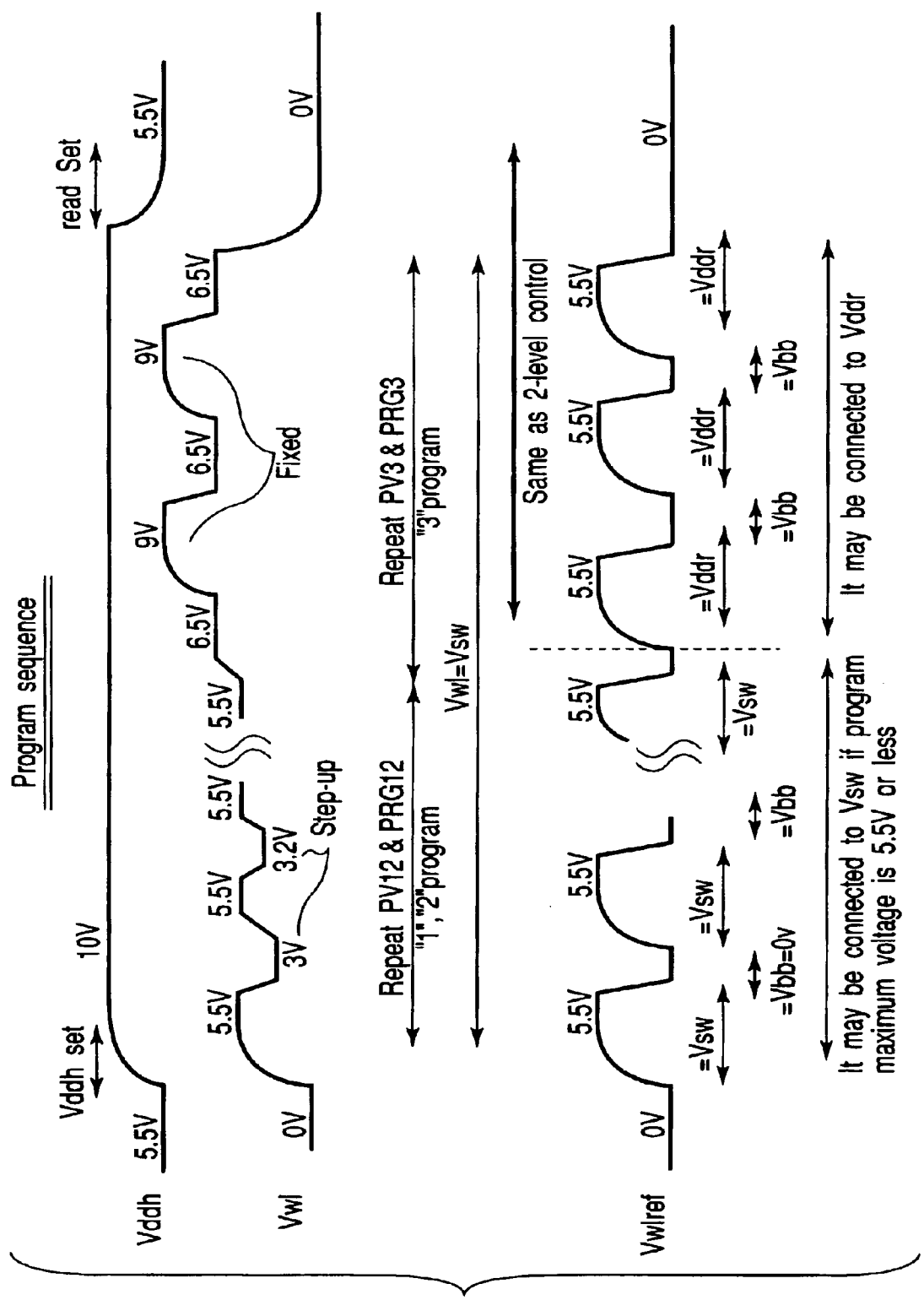
FIG. 23 is an operation waveform chart showing an operation example in program sequence of the third embodiment.

FIG. 23 shows an outline of sequence when the program of 2-level/4-level is achieved in the Flash memory.

Figure 24:
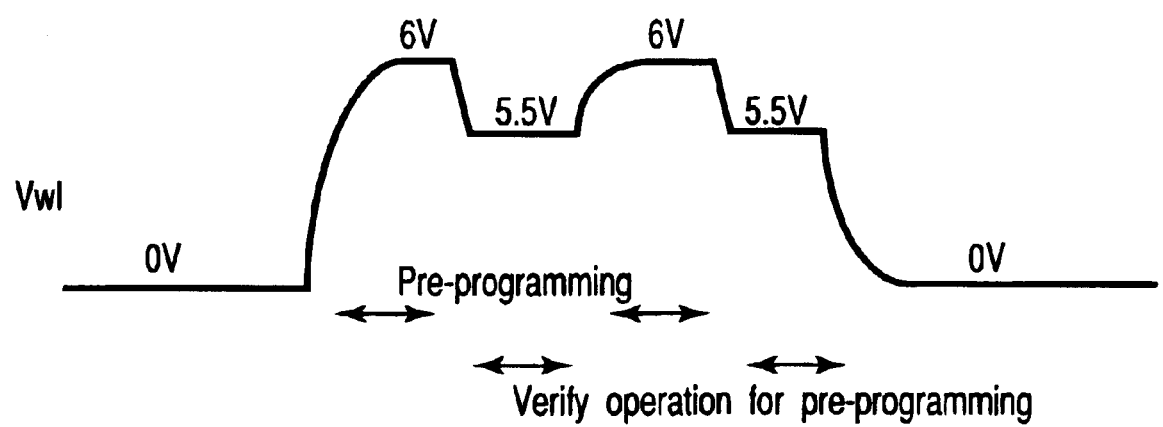
FIG. 24 is an operation waveform chart showing an operation example in pre-program sequence of the third embodiment.

FIG. 24 shows an outline of sequence when the pre-program of 2-level/4-level is achieved in the Flash memory.

As FIG. 24 depicts, the pre-program voltage of 6 V is lower than the level 3 write voltage of 9 V (see FIG. 23). This increases the number of bits that can be written at the same time. Hence, it is possible to shorten the time required to achieve the pre-program operation, as in the first and second embodiments.

The pre-program voltage may be equal to either the level 1 write voltage or the level 2 write voltage. In this case, one voltage-generating circuit suffices, for applying the pre-program voltage and the level 1 or level 2 write voltage. This helps simplify the integrated circuit. Nonetheless, a voltage-generating circuit may be provided to generate the pre-program voltage, in addition to the two circuits that generate either level 1 write voltage and the level 2 write voltage, respectively.

Similarly, the voltage for verifying the pre-program may be equal to either the level 1 verify voltage or the level 2 verify voltage. In this case, too, one voltage-generating circuit suffices, for applying the voltage for verifying the pre-program and for applying the level 1 or level 2 verify voltage. This serves simplify the integrated circuit. However, a voltage-generating circuit may be provided to generate the voltage for verifying the pre-program, in addition to the two circuits that generate either level 1 write voltage and the level 2 write voltage, respectively.

Although the present invention has been described based on the first to third embodiments, the present invention is not restricted to each of these embodiments, various modifications can be made without departing from the scope of the invention when embodying the present invention.

Moreover, each of the foregoing embodiments can be solely carried out, but these embodiments can also be appropriately combined and carried out.

In addition, each of the foregoing embodiments includes the invention on the various stages, and the invention on the various stages can be extracted by appropriate combinations of a plurality of structural requirements disclosed in each of the foregoing embodiments.

Additionally, although the present invention has been described based on the example in which the invention is applied to the nonvolatile semiconductor memory device in the foregoing embodiments, a semiconductor integrated circuit device having the above-described nonvolatile semiconductor memory device included therein, e.g., a processor or a system LSI is in the category of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a programming operation by which a nonvolatile memory cell in an erased state is programmed to a programmed state according to an input program data;
   a pre-programming operation by which at least more than one nonvolatile memory cell in the erased state in a memory block including a plurality of nonvolatile memory cells are simultaneously pre-programmed to an intermediate state between the programmed and erased states; and
   an erasing operation by which all the nonvolatile memory cells in the memory block are simultaneously erased to the erased state.

2. The device according to claim 1, wherein programming to the nonvolatile memory cells in the erased state is performed by using channel hot-electron injection, and carried out with respect to a plurality of the nonvolatile memory cells in the erased state at the same time.

3. The device according to claim 1, further comprising:
   a plurality of bit lines;
   a plurality of nonvolatile memory cells electrically connected to the plurality of the bit lines; and
   a program bit number variable circuit which selects n (n is a natural number) bit lines to program among the plurality of the bit lines in accordance with a first signal, and selects m (m is a natural number and m is different from n) bit lines to program in accordance with a second signal the number of m bit lines being larger than the number of n bit lines.

4. The device according to claim 3, wherein, when the m bit lines are selected, the program voltage applied to the gate of the nonvolatile memory cell is lower than that when the n bit lines are selected.

5. The device according to claim 3, wherein the first signal is a signal indicative of program operation and the second signal is a signal indicative of pre-program operation.

6. The device according to claim 1, further comprising:
a voltage generating circuit which generates a first program voltage and a first verify voltage in accordance with a first signal, and generates a second program voltage different from the first program voltage and a second verify voltage different from the first verify voltage in accordance with a second signal; and
a plurality of nonvolatile memory cells which receive the first program voltage, the first verify voltage, the second program voltage and the second verify voltage at a gate.

7. The device according to claim 6, wherein, when the program voltage is the second program voltage, a number of the nonvolatile memory cell to which data is simultaneously programmed is larger than that when the program voltage is the first program voltage.

8. The device according to claim 6, wherein the first signal is a signal indicative of program operation and the second signal is a signal indicative of pre-program operation.

9. The device according to claim 1, the program operation including:
setting a number of simultaneous program bits;
applying a program voltage to a word line;
applying a bit line program voltage in accordance with the program data to a bit line; and
verifying a programmed data,
the pro-program operation including:
setting a number of simultaneous program bits is larger than that of the program operation;
applying a program voltage which is lower than that of the program operation to the word line;
applying a bit line program voltage to the bit line, number of applying times is smaller than that of the program operation; and
verifying a pre-programmed data.

10. A semiconductor integrated circuit device comprising:
a programming operation by which a threshold voltage lower than a first voltage for a nonvolatile memory cell is increased to a threshold voltage higher than a second voltage according to an input program data;
a pre-programming operation by which a threshold voltage for at least more than one nonvolatile memory cell in the erased state in a memory block including a plurality of nonvolatile memory cells are simultaneously increased to a threshold voltage between the first and second voltages; and
an erasing operation by which the highest threshold voltage among threshold voltages for all the nonvolatile memory cells in the memory block is decreased to a threshold voltage lower than the first voltage.

11. The device according to claim 10, wherein programming to the nonvolatile memory cells in the erased state is performed by using channel hot-electron injection, and carried out with respect to a plurality of the nonvolatile memory cells in the erased state at the same time.

12. The device according to claim 10, further comprising:
a plurality of bit lines;
a plurality of nonvolatile memory cells electrically connected to the plurality of the bit lines; and
a program bit number variable circuit which selects n (n is a natural number) bit lines to program among the plurality of the bit lines in accordance with a first signal, and selects m (m is a natural number and m is different from n) bit lines to program in accordance with a second signal, the number of m bit lines being larger than the number of n bit lines.

13. The device according to claim 12, wherein, when the m bit lines are selected, the program voltage applied to the gate of the nonvolatile memory cell is lower than that when the n bit lines are selected.

14. The device according to claim 12, wherein the first signal is a signal indicative of program operation and the second signal is a signal indicative of pre-program operation.

15. The device according to claim 10, further comprising:
a voltage generating circuit which generates first program voltage and a first verify voltage in accordance with a first signal, and generates a second program voltage different from the first program voltage and a second verify voltage different from the first verify voltage in accordance with a second signal; and
a plurality of nonvolatile memory cells which receive the first program voltage, the first verify voltage, the second program voltage and the second verify voltage at a gate.

16. The device according to claim 15, wherein when the program voltage is the second program voltage, a number of the nonvolatile memory cells to which data is simultaneously programmed is larger than that when the program voltage is the first program voltage.

17. The device according to claim 15, wherein the first signal is a signal indicative of program operation and the second signal is a signal indicative of pre-program operation.

18. A semiconductor integrated circuit device comprising:
a programming circuit by which a nonvolatile memory cell in an erased state is programmed to a programmed state according to an input program data;
a pre-programming circuit by which at least more than one nonvolatile memory cell in the erased state in a memory block including a plurality of nonvolatile memory cells are simultaneiously pre-programmed to an intermediate state between the programmed and erased states; and
an erasing circuit by which all the nonvolatile memory cells in the memory block are simultaneously erased to the erased state.

19. A semiconductor integrated circuit device comprising:
a programming circuit by which a threshold voltage lower than a first voltage for a nonvolatile memory cell is increased to a threshold voltage higher than a second voltage according to an input program data;
a pre-programming circuit by which a threshold voltage for at least more than one nonvolatile memory cell in the erased state in a memory block including a plurality of nonvolatile memory cells are simultaneously increased to a threshold voltage between the first and second voltages; and
an erasing circuit by which the highest threshold voltage among the threshold voltages for all the nonvolatile memory cells in the memory block is decreased to a threshold voltage lower than the first voltage.

20. A semiconductor integrated circuit device comprising:

a programming operation by which a nonvolatile memory cell in an erased state is programmed to one of at least two programmed states according to an input program data;

a pre-programming operation by which at least more than one nonvolatile memory cell in the erased state in a memory block including a plurality of nonvolatile memory cells are simultaneously pre-programmed to an intermediate state between one of the programmed states and erased state; and an erasing operation by which all the nonvolatile memory cells in the memory block are simultaneously erased to the erased state.

21. The device according to claim 20, further comprising:

a plurality of bit lines;

a plurality of nonvolatile memory cells electrically connected to the plurality of the bit lines; and a program bit number variable circuit which selects n (n is a natural number) bit lines to program among the plurality of the bit lines in accordance with a first signal, and selects m (m is a natural number and m is different from n) bit lines to program in accordance with a second signal the number of m bit lines being larger than the number of n bit lines.

22. The device according to claim 20, further comprising:

a voltage generating circuit which generates a first program voltage and a first verify voltage in accordance with a first signal, and generates a second program voltage different from the first program voltage and a second verify voltage different from the first verify voltage in accordance with a second signal; and a plurality of nonvolatile memory cells which receive the first program voltage, the first verify voltage, the second program voltage and the second verify voltage at a gate.

23. A semiconductor integrated circuit device comprising:

a programming operation by which a threshold voltage lower than a first voltage for a nonvolatile memory cell is increased to a threshold voltage higher than one of at least two different voltages according to an input program data;

a pre-programming operation by which a threshold voltage for at least more than one nonvolatile memory cell in the erased state in a memory block including a plurality of nonvolatile memory cells are simultaneously increased to a threshold voltage between one of said at least two different voltages and first voltage; and an erasing operation by which the highest threshold voltage among the threshold voltages or all the nonvolatile memory cells in the memory block is decreased to a threshold voltage lower than the first voltage.

24. The device according to claim 23, further comprising:

a plurality of bit lines;

a plurality of nonvolatile memory cells electrically connected to the plurality of the bit lines; and a program bit number variable circuit which selects n (n is a natural number) bit lines to program among the plurality of the bit lines in accordance with a first signal, and selects m (m is a natural number and m is different from n) bit lines to program in accordance with a second signal, the number of m bit lines being larger than the number of n bit lines.

25. The device according to claim 23, further comprising:

a voltage generating circuit which generates a first program voltage and a first verify voltage in accordance with a first signal, and generates a second program voltage different from the first program voltage and a second verify voltage different from the first verify voltage in accordance with a second signal; and a plurality of nonvolatile memory cells which receive the first program voltage, the first verify voltage, the second program voltage and the second verify voltage at a gate.

* * * * *